US010862496B1

(12) United States Patent
Neto

(10) Patent No.: US 10,862,496 B1
(45) Date of Patent: Dec. 8, 2020

(54) HIGH-SPEED SUCCESSIVE-APPROXIMATION-REGISTER (SAR) ANALOG-TO-DIGITAL CONVERTER (ADC) CONTROL LOGIC CIRCUIT

(71) Applicant: Xilinx, Inc., San Jose, CA (US)

(72) Inventor: Pedro W. Neto, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/525,986

(22) Filed: Jul. 30, 2019

(51) Int. Cl.
  *H03M 1/38* (2006.01)
  *H03M 1/46* (2006.01)

(52) U.S. Cl.
  CPC .................. *H03M 1/462* (2013.01)

(58) Field of Classification Search
  CPC ........... H03M 1/462; H03M 1/00; H03M 3/00
  USPC .................................. 341/161, 155
  See application file for complete search history.

(56) References Cited

U.S. PATENT DOCUMENTS

| | | | | |
|---|---|---|---|---|
| 4,090,257 A * | 5/1978 | Williams | ............... | G11C 16/28 257/324 |
| 7,019,999 B1 * | 3/2006 | Srinivasan | ............. | G11C 15/04 365/168 |
| 7,502,059 B2 * | 3/2009 | Barna | .................. | H04N 5/3598 327/65 |
| 8,970,419 B2 | 3/2015 | Farley et al. | | |
| 9,503,058 B1 | 11/2016 | Cical et al. | | |
| 10,236,901 B1 | 3/2019 | Neto | | |

(Continued)

OTHER PUBLICATIONS

Lukas Kull, Thomas Toifl, Martin Schmatz, Pier Andrea Francese, Christian Menolfi, Matthias Braendli, Marcel Kossel, Thomas Morf, Toke Meyer Andersen, and Yusuf Leblebici, A 3.1 mW 8b 1.2 GS/s Single-Channel Asynchronous SAR ADC with Alternate Comparators for Enhanced Speed in 32 nm Digital SOI CMOS, IEEE Journal of Solid-State Circuits, Dec. 2013, 10 pages, vol. 48, No. 12.

(Continued)

*Primary Examiner* — Peguy Jean Pierre
(74) *Attorney, Agent, or Firm* — Patterson + Sheridan, LLP

(57) ABSTRACT

Apparatus and associated methods relate to a logic circuit having a number of unit circuits performing buffering and data storage functionalities in parallel. In an illustrative example, a logic circuit may include N unit circuits for data storage and N–1 unit circuits for buffering. During a conversion cycle, only an $i^{th}$ unit circuit of the N unit circuits and an $(i-1)^{th}$ unit circuit of the N–1 unit circuits may be enabled. Output status of the $i^{th}$ unit circuit of the N unit circuits may be monitored to disable the $i^{th}$ unit circuit, and also enable an $(i-1)^{th}$ unit circuit of the N unit circuits and an $(i-2)^{th}$ unit circuit of the N–1 unit circuits. By performing buffering and data storage in parallel, propagation delays in the SAR logic circuit may advantageously be reduced, and thus, conversion time of a successive-approximation-register (SAR) analog-to-digital converter (ADC) may be advantageously reduced.

17 Claims, 9 Drawing Sheets

(56) References Cited

U.S. PATENT DOCUMENTS

2004/0201420 A1* 10/2004 Liu ................. H03F 3/45179
330/253
2005/0180224 A1* 8/2005 Tzartzanis ............. G11C 7/062
365/189.09
2017/0302178 A1* 10/2017 Bandyopadhyay .. H03K 17/284

OTHER PUBLICATIONS

Lukas Kull, Thomas Toifl, Martin Schmatz, Pier Andrea Francese, Christian Menolfi, Matthias Braendli, Marcel Kossel, Thomas Morf, Toke Meyer Andersen, Yusuf Leblebici, A 90GS/s 8b 667mW 64$^x$ Interleaved SAR ADC in 32nm Digital SOI CMOS, 2014 IEEE International Solid-State Circuits Conference, 3 pages, San Francisco, CA.

Bob Verbruggen, Masao Iriguchi, and Jan Craninckx, A 1.7 mW 11 b 250 MS/s 2-Times Interleaved Fully Dynamic Pipelined SAR ADC in 40 nm Digital CMOS, IEEE Journal of Solid-State Circuits, Dec. 2012, 8 pages, vol. 47, No. 12, San Francisco, CA, USA.

Young-Deuk Jeon, Young-Kyun Cho, Jae-Won Nam, Kwi-Dong Kim, Woo-Yol Lee, Kuk-Tae Hong, and Jong-Kee Kwon, A 9.15mW 0.22mm2 10b 204MS/s Pipelined SAR ADC in 65nm CMOS, IEEE, 2010, 4 pages, San Jose, CA, USA.

Chun-Cheng Liu, Soon-Jyh Chang, Guan-Ying Huang, and Ying-Zu Lin, A 10-bit 50-MS/s SAR ADC With a Monotonic Capacitor Switching Procedure, IEEE Journal of Solid-State Circuits, Apr. 2010, 10 pages, vol. 45, No. 4, USA.

Samuel Palermo, Sebastian Hoyos, Ayman Shafik, Ehsan Zhian Tabasy, Shengchang Cai, Shiva Krian, and Keytaek Lee, CMOS ADC-Based Receivers for High-Speed Electrical and Optical Links, IEEE Communications Magazine, Oct. 2016, 8 pages, USA.

Jen-Huan Tsai, Hui-Huan Wang, Yang-Chi Yen, Chang-Ming Lai, Yen-Ju Chen, Po-Chuin Huang, Ping-Hsuan Hsieh, Hsin Chen, and Chao-Cheng Lee, A 0.003 mm2 10 b 240 MS/s 0.7 mW SAR ADC in 28 nm CMOS With Digital Error Correction and Correlated-Reversed Switching, IEEE Journal of Solid-State Circuits, Jun. 2015, 17 pages, vol. 50, No. 6, USA.

Kalmeshwar N. Hosur, Girish V. Attimarad, Harish M. Kittur, and S. S. Kerur, Design and simulation of Low Power Successive Approximation Register for A/D Converters using 0.18um CMOS Technology, International Journal of Engineering and Technology (IJET), May 2016, 9 pages, vol. 8, No. 2.

* cited by examiner

| rst | ens$_i$ | en$_i$ | Q$_i$ | Qb$_i$ |
|---|---|---|---|---|
| 0 | 0 | 0 | V$_{CNi}^{-1}$ | V$_{CPi}^{-1}$ |
| 0 | 0 | 1 | V$_{CNi}^{-1}$ | V$_{CPi}^{-1}$ |
| 0 | 1 | 0 | V$_{CNi}^{-1}$ | V$_{CPi}^{-1}$ |
| 0 | 1 | 1 | V$_{CNi}$ | V$_{CPi}$ |
| 1 | 0 | 0 | 0 | 0 |
| 1 | 0 | 1 | 0 | 0 |
| 1 | 1 | 0 | 0 | 0 |
| 1 | 1 | 1 | 0 | 0 |

HIGH-SPEED SUCCESSIVE-APPROXIMATION-REGISTER (SAR) ANALOG-TO-DIGITAL CONVERTER (ADC) CONTROL LOGIC CIRCUIT

TECHNICAL FIELD

Various embodiments relate generally to integrated circuits (ICs), and more specifically, to analog-to-digital converters (ADCs).

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space. Some wireless links may transport information in the form of light.

At a receiver in a digital communication system, a digitally-encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled.

SUMMARY

Apparatus and associated methods relate to a logic circuit having a number of unit circuits performing buffering and data storage functionalities in parallel. In an illustrative example, a logic circuit may include N unit circuits for data storage and N−1 unit circuits for buffering. During a conversion cycle, only an $i^{th}$ unit circuit of the N unit circuits and an $(i-1)^{th}$ unit circuit of the N−1 unit circuits may be enabled. Output status of the $i^{th}$ unit circuit of the N unit circuits may be monitored to disable the $i^{th}$ unit circuit, and also enable an $(i-1)^{th}$ unit circuit of the N unit circuits and an $(i-2)^{th}$ unit circuit of the N−1 unit circuits. By performing buffering and data storage in parallel, propagation delays in the SAR logic circuit may advantageously be reduced, and thus, conversion time of a successive-approximation-register (SAR) analog-to-digital converter (ADC) may be advantageously reduced.

Various embodiments may achieve one or more advantages. For example, some embodiments may use innovative, ultra-high-speed, dynamic unit circuits to perform buffering and data storage to minimize the buffering delay at the SAR critical timing loop. Some embodiments may use parallel operation between the storage and buffering to enable separated optimization of power and speed on each storage path and buffering path. Thus, an ADC that implements the parallel operation between the storage and buffering in a SAR logic circuit may achieve high-speed performance. In some embodiments, a unit circuit used for storage and a unit circuit used for buffering may have the same structure; thus, the fabrication process of a SAR logic circuit may be advantageously simplified. In some embodiments, the resolution of a SAR logic circuit may be programmed to support different ADCs. Some embodiments may provide a SAR logic circuit that allows for configuration and scalability by implementing the unit circuit-based structure.

Some embodiments may provide a unit circuit with variable input capacitances, for example, when a unit circuit is disabled, the input capacitance may be, for example, the junction capacitance of a transistor. When a unit circuit is enabled, the input capacitance may include parasitic capacitances of wirings, gate capacitance, and junction capacitances. Thus, the unit circuit input capacitance may be substantially reduced when a unit circuit is disabled. Therefore, a comparator system used to power a number of unit circuits may only need to power a small capacitance during the operation of a SAR logic circuit. A smaller driver may be used in a SAR ADC, and the package size of the SAR ADC may be advantageously reduced.

In one exemplary aspect, a circuit includes (a) a first transistor having a first gate terminal, a first source terminal, and a first drain terminal, wherein the first gate terminal is coupled to receive a first differential comparison decision signal, the first source terminal is coupled to a predetermined power supply, (b) a second transistor having a second gate terminal, a second source terminal, and a second drain terminal, wherein the second gate terminal is coupled to receive a second differential comparison decision signal, the second source terminal is coupled to the predetermined power supply, (c) a third transistor having a third gate terminal, a third source terminal, and a third drain terminal, wherein the third drain terminal is coupled to the first drain terminal, the third source terminal is coupled to a predetermined reference voltage, and, (d) a fourth transistor having a fourth gate terminal, a fourth source terminal, and a fourth drain terminal, wherein the fourth drain terminal is coupled to the second drain terminal, the fourth source terminal is coupled to the predetermined reference voltage, the third gate terminal is coupled to the fourth drain terminal, and the fourth gate terminal is coupled to the third drain terminal.

In some embodiments, the circuit may also include (a) a fifth transistor having a fifth gate terminal, a fifth source terminal, and a fifth drain terminal, the fifth source terminal may be coupled to the first gate terminal, the fifth gate terminal may be controlled by an enabling signal, (b) a sixth transistor, having a sixth gate terminal, a sixth source terminal and a sixth drain terminal, connected to the fifth transistor in series, the sixth drain terminal may be coupled to receive the first differential comparison decision signal, and the six gate terminal may be controlled by a stop enabling signal, (c) a seventh transistor having a seventh gate terminal, a seventh source terminal and a seventh drain terminal, the seventh source terminal may be coupled to the second gate terminal, the seventh gate terminal may be controlled by the enabling signal, and, (d) an eighth transistor, having an eighth gate terminal, an eighth source terminal, and an eighth drain terminal, connected to the seventh transistor in series, the eighth drain terminal may be coupled to receive the second differential comparison decision signal, and the eighth gate terminal may be controlled by the stop enabling signal.

In some embodiments, the circuit may also include (a) a ninth transistor connected with the third transistor in parallel, a ninth gate terminal of the ninth transistor may be controlled by a reset signal, and (b) a tenth transistor connected with the fourth transistor in parallel, a tenth gate terminal of the tenth transistor may be controlled by the reset signal. In some embodiments, the circuit may also include (a) an eleventh transistor connected with a twelfth transistor in parallel, and, (b) a thirteenth transistor connected with a fourteenth transistor in parallel, source terminals of the eleventh transistor, the twelfth transistor, the thirteenth transistor, and fourteenth transistor may be connected to the predetermined power supply, drain terminals of the eleventh transistor and the twelfth transistor may be connected to the first gate terminal, drain terminals of the thirteenth transistor and the fourteenth transistor may be connected to the second gate terminal, gate terminals of the eleventh transistor and the thirteenth transistor may be controlled by an enabling signal, and, gate terminals of the twelfth transistor and the twelfth transistor may be controlled by an inverted signal of the reset signal.

In another exemplary aspect, a system includes a sequencer, having N unit circuits, coupled to receive one or more comparison decision signals from a comparator system, each unit circuit of the N unit circuits includes (a) a first transistor having a first gate terminal, a first source terminal, and a first drain terminal, wherein the first gate terminal is coupled to receive a first differential comparison decision signal, the first source terminal is coupled to a predetermined power supply, (b) a second transistor having a second gate terminal, a second source terminal, and a second drain terminal, wherein the second gate terminal is coupled to receive a second differential comparison decision signal, the second source terminal is coupled to the predetermined power supply, (c) a third transistor having a third gate terminal, a third source terminal, and a third drain terminal, wherein the third drain terminal is coupled to the first drain terminal, the third source terminal is coupled to a predetermined reference voltage, and, (d) a fourth transistor having a fourth gate terminal, a fourth source terminal, and a fourth drain terminal, wherein the fourth drain terminal is coupled to the second drain terminal, the fourth source terminal is coupled to the predetermined reference voltage, the third gate terminal is coupled to the fourth drain terminal, and the fourth gate terminal is coupled to the third drain terminal.

In some embodiments, the system may also include a buffering system, having N−1 unit circuits, coupled to receive one or more comparison decision signals from the comparator system, each unit circuit of the N−1 unit circuits may have the same structure with the unit circuit of the N unit circuits. In some embodiments, an $i^{th}$ unit circuit in the sequencer may be configured to receive an $i^{th}$ comparison decision signal from the comparator system to generate an $i^{th}$ output signal, and, an $(i-1)^{th}$ unit circuit in the buffering system configured to receive the $i^{th}$ comparison decision signal to generate an $i^{th}$ buffering signal.

In some embodiments, the system may also include (a) an $i^{th}$ NOR gate in the sequencer coupled to receive the $i^{th}$ output signal and generate a stop enabling signal for the $i^{th}$ unit circuit of the sequencer, and, (b) an $i^{th}$ inversion circuit in the sequencer coupled to receive the stop enabling signal to generate an enable signal for an $(i-1)^{th}$ unit circuit of the sequencer and an $(i-2)^{th}$ unit circuit of the buffering system. In some embodiments, the system may also include an $i^{th}$ NOR gate in the buffering system coupled to receive the $i^{th}$ buffering signal and generate a stop enabling signal for the $i^{th}$ unit circuit of the buffering system.

In some embodiments, the system may also include (a) an n-input selector configured to receive N enabling signals of the N unit circuits in the sequencer and generate a clock signal in response to a selection signal, and, (b) a decoder configured to receive a command signal to generate the selection signal. In some embodiments, the comparator system may include up to N comparators.

In another exemplary aspect, a method includes (a) providing a first transistor having a first gate terminal, a first source terminal, and a first drain terminal, coupling the first gate terminal to receive a first differential comparison decision signal and coupling the first source terminal to a predetermined power supply, (b) providing a second transistor having a second gate terminal, a second source terminal, and a second drain terminal, coupling the second gate terminal to receive a second differential comparison decision signal and coupling the second source terminal to the predetermined power supply, (c) providing a third transistor having a third gate terminal, a third source terminal, and a third drain terminal, coupling the third drain terminal to the first drain terminal and coupling the third source terminal to a predetermined reference voltage, (d) providing a fourth transistor having a fourth gate terminal, a fourth source terminal, and a fourth drain terminal, coupling the fourth drain terminal to the second drain terminal and coupling the fourth source terminal to the predetermined reference voltage, and, (e) coupling the third gate terminal to the fourth drain terminal and coupling the fourth gate terminal to the third drain terminal.

In some embodiments, the method may also include (a) providing a fifth transistor having a fifth gate terminal, a fifth source terminal, and a fifth drain terminal, coupling the fifth source terminal to the first gate terminal and coupling the fifth gate terminal to an enabling signal, and, (b) providing a seventh transistor having a seventh gate terminal, a seventh source terminal, and a seventh drain terminal, coupling the seventh source terminal to the second gate terminal and coupling the seventh gate terminal to the enabling signal.

In some embodiments, the method may also include (a) providing a sixth transistor having a sixth gate terminal, a sixth source terminal, and a sixth drain terminal, and connecting the sixth transistor to the fifth transistor in series, coupling the sixth drain terminal to receive the first differential comparison decision signal, and coupling the six gate terminal to a stop enabling signal, and, (b) providing an eighth transistor having an eighth gate terminal, an eighth source terminal, and an eighth drain terminal, connected the eighth transistor to the seventh transistor in series, and coupling the eighth drain terminal to receive the second differential comparison decision signal, and coupling the eighth gate terminal to the stop enabling signal.

In some embodiments, the method may also include (a) providing a ninth transistor connected to the third transistor in parallel, wherein a gate terminal of the ninth transistor may be controlled by a reset signal, and, (b) providing a tenth transistor connected to the fourth transistor in parallel, wherein a gate terminal of the tenth transistor may be controlled by the reset signal.

In some embodiments, the method may also include (a) providing an eleventh transistor connected to a twelfth transistor in parallel, (b) providing a thirteenth transistor connected to a fourteenth transistor in parallel. Source terminals of the eleventh transistor, the twelfth transistor, the thirteenth transistor, and fourteenth transistor may be connected to the predetermined power supply, drain terminals of the eleventh transistor and the twelfth transistor may be connected to the first gate terminal, drain terminals of the thirteenth transistor and the fourteenth transistor may be connected to the second gate terminal, gate terminals of the eleventh transistor and the thirteenth transistor may be controlled by the enabling signal, and, gate terminals of the twelfth transistor and the twelfth transistor may be controlled by an inverted reset signal.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to a logic circuit having a number of unit circuits performing buffering and data storage functionalities in parallel. In an illustrative example, a logic circuit may include N unit circuits for data storage and N−1 unit circuits for buffering. During a conversion cycle, only an $i^{th}$ unit circuit of the N unit circuits and an $(i-1)^{th}$ unit circuit of the N−1 unit circuits may be enabled. Output status of the $i^{th}$ unit circuit of the N unit circuits may be monitored to disable the $i^{th}$ unit circuit, and also enable an $(i-1)^{th}$ unit circuit of the N unit circuits and an $(i-2)^{th}$ unit circuit of the N−1 unit circuits. By performing buffering and data storage in parallel, propagation delays in the SAR logic circuit may advantageously be reduced, and thus, conversion time of a successive-approximation-register (SAR) analog-to-digital converter (ADC) may be advantageously reduced.

To aid understanding, this document is organized as follows. First, an exemplary platform (e.g., FPGA) suitable to perform data communication and signal conversion is briefly introduced with reference to FIG. 1. Second, with reference to FIGS. 2-4, the discussion turns to exemplary embodiments that illustrate a successive-approximation-register (SAR) logic circuit having parallel operation functionalities in an analog-to-digital converter (ADC). Then, with reference to FIG. 5A-FIG. 7, exemplary architectures of a unit circuit used in the SAR logic circuit and methods to implement and operate the unit circuit are discussed. Finally, with reference to FIGS. 8-9, further discussion is presented to explain exemplary methods to program and operate the SAR logic circuit.

Figure 1:
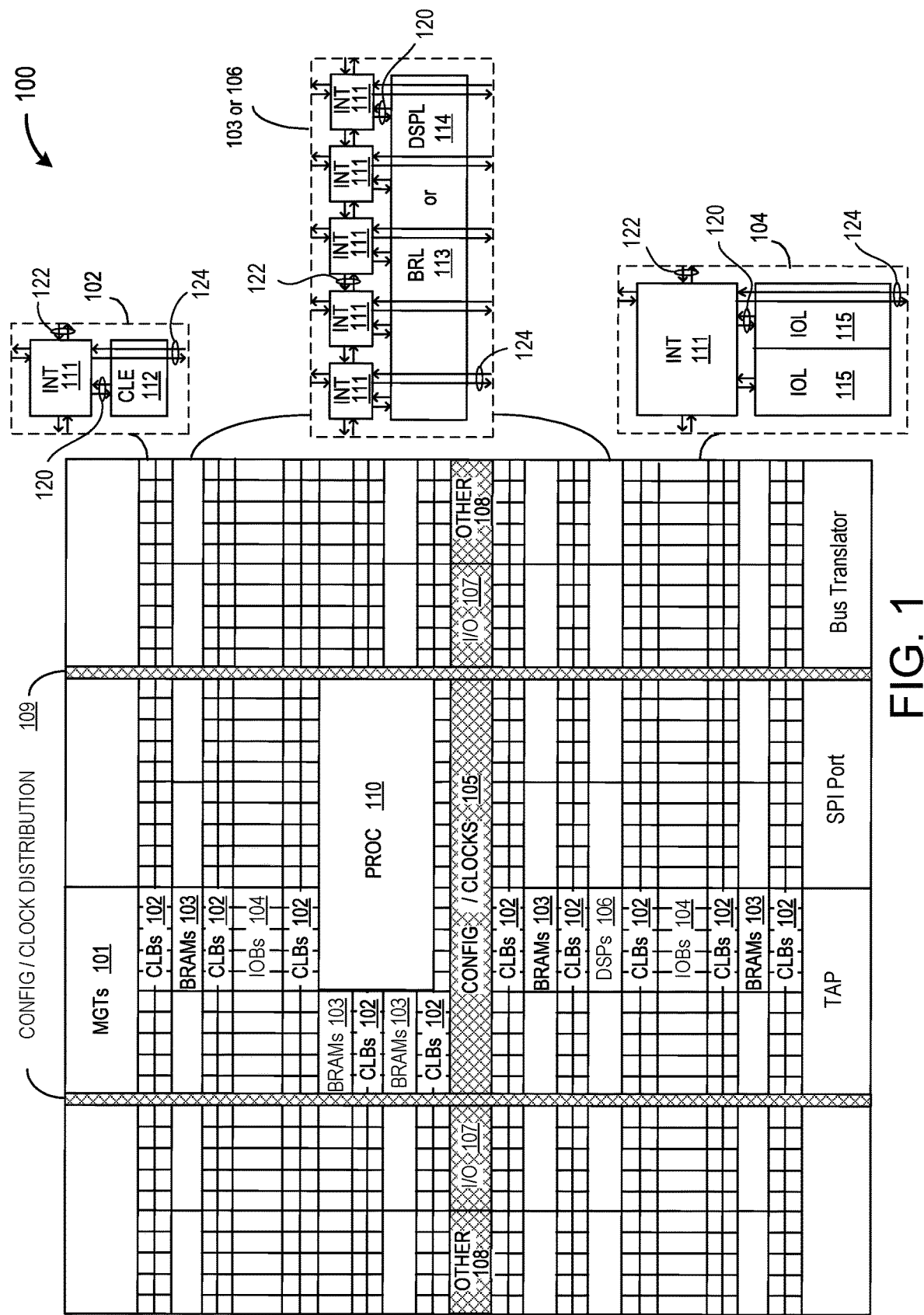
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes field programmable gate array (FPGA) logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An 10B 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA)), such as the programmable IC 100, for example, may be used in a communication system to support various data communication protocols over wide frequency ranges while using progressively smaller areas. In various examples, analog signal levels may be converted into digital voltages, digital currents or digital charge signals using an analog-to-digital converter (ADC). Successive-approximation-register (SAR) ADC is a type of ADC that may convert a continuous analog waveform into a discrete digital representation via, for example, a binary search, through all possible quantization levels before finally converging upon a digital output for each conversion. A SAR logic circuit used in the SAR ADC may include logic circuits to perform buffering and data storage functionalities. In a high-speed SAR design, reducing propagation delays in the SAR logic circuit may advantageously reduce conversion time of the ADC.

Figure 2:
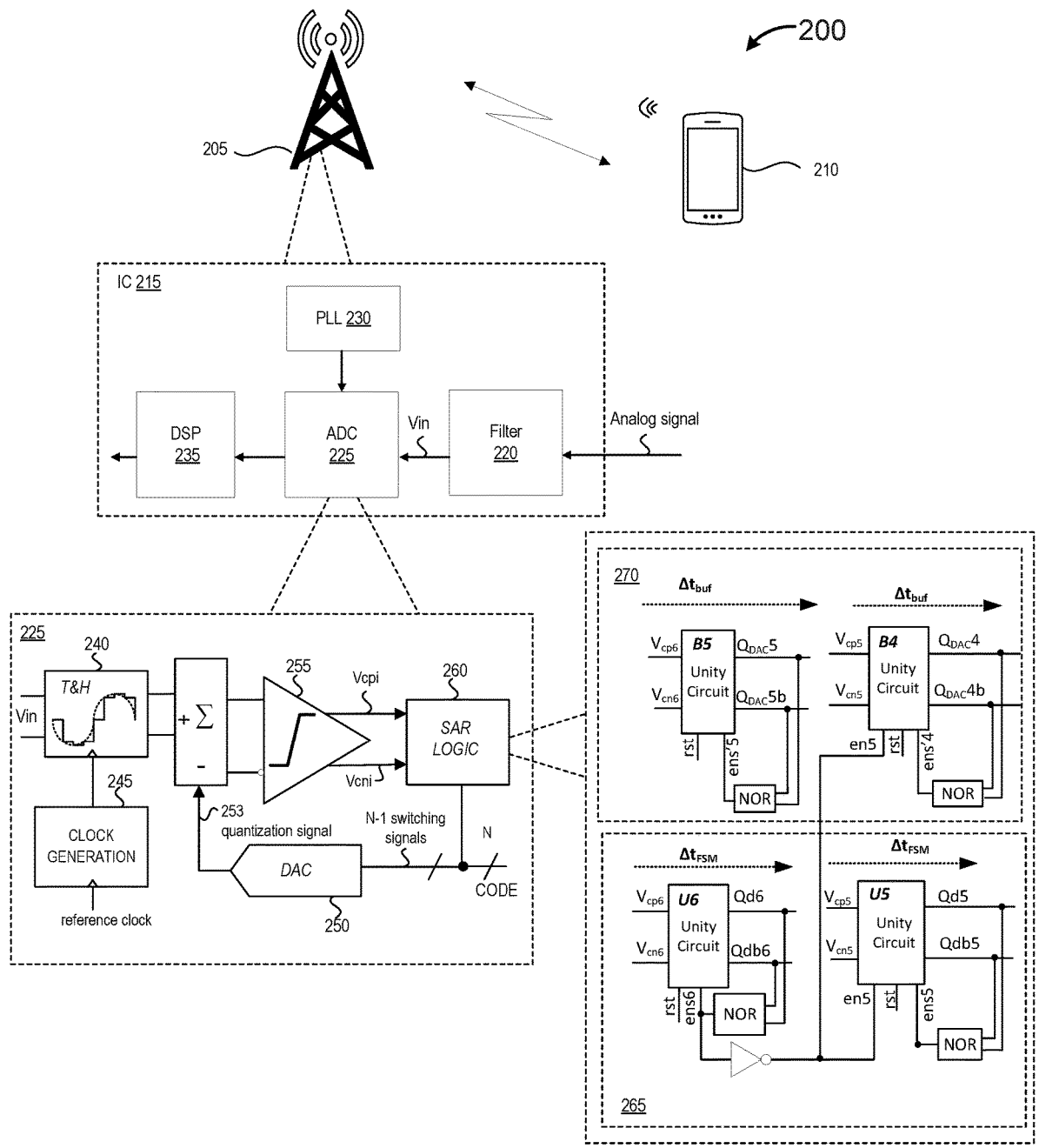
FIG. 2 depicts an analog-to-digital converter (ADC) having an exemplary successive-approximation-register (SAR) logic implemented in an IC.

FIG. 2 depicts an analog-to-digital converter (ADC) having an exemplary successive-approximation-register (SAR) logic implemented in an IC. In this depicted example, a communication system 200 includes a base station 205 to transmit and/or receive data from some data communication devices. In this example, the base station 205 receives an analog signal from a portable communication device 210 (e.g., cell phone). The base station 205 includes an integrated circuit (IC) 215 to perform data communications through an antenna (not shown) between the base station 205 and the cell phone 210. For example, IC 215 includes a filter (e.g., a low-pass filter) 220 to filter noises in the analog signal. An analog-to-digital converter (ADC) 225 may sample and convert the filtered analog signal into a digital signal. The sampling and conversion may be controlled by different clock signals. A phase-locked-loop (PLL) 230 may be used to provide the clock signals. The digital signal may be then processed by a digital signal processor (DSP) 235, for example.

In this illustrative example, the ADC 225 is an N-bit SAR ADC where output code (e.g., the digital signal) of the ADC is defined during N successive approximation cycles (SA cycles), with N being the SAR number of bits. The total conversion cycle duration, in an N-bit SAR ADC, may be at least N successive approximation cycles plus one tracking period. In each SA cycle, the difference between a sampled input and an internal digital-to-analog converter (DAC) output may be compared against zero. If the difference is positive, a bit one may be attributed to the correspondent SA cycle, and the DAC may increase its output magnitude. If the difference is negative, the corresponding SA cycle bit may be zero and the DAC output magnitude may be reduced.

In this depicted example, the SAR ADC 225 includes a track and hold circuit 240 used to perform a sample and hold operations on a differential incoming signal $V_{in}$ (e.g., the filtered analog signal) to generate a differential sampled signal during a sample stage. A clock generation circuit 245 may be used to generate sampling clock signals for the track and hold circuit 240. The SAR ADC 225 also includes an N−1 bits digital-to-analog converter (DAC) 250 to generate a quantization signal 253 according to N−1 switch control signals. In some embodiments, the DAC 250 may be a charge redistribution DAC (CDAC).

The SAR ADC 225 also includes a comparator system 255. In some embodiments, the comparator system 255 may include one or more (e.g., 2, 3, . . . N) differential dynamic comparators. In some embodiments, the clock generation circuit 245 may also generate clock signals for the one or more differential dynamic comparators in the comparator system 255. For example, when the comparator system 255 includes two differential dynamic comparators, the clock generation circuit 245 may generate two asynchronous clock signals to dynamically enable one of the two comparators at a rising edge of a corresponding clock signal.

The comparator system 255 may selectively enable one or more (e.g., 2, 3, . . . , N, for example) differential dynamic comparators to compare the sampled signal with the quantization signal 253 to generate a comparison signal (e.g., a differential comparison signal having a first differential comparison signal $V_{cpi}$ and a second differential comparison signal $V_{cni}$) to a SAR logic circuit 260. The SAR logic circuit 260 may be used for successively changing the content of the N−1 switch control signals during a voltage comparison stage to vary the quantization signal 253, enabling the next SA cycle and stop the conversion cycle after the last conversion, and successively receiving the differential comparison signal $V_{cpi}$, $V_{cni}$ to generate an N-bit digital output code.

In this depicted example, the SAR logic circuit 260 includes a sequencer 265 connected to the comparator system 255 outputs $V_{cpi}$, $V_{cni}$ to generate enabling signals for the SA cycles and store the converted data. The sequencer 265 may generate enabling signals for N SA cycles and store converted data. A buffer system 270 may be arranged between the comparator system 255 outputs and the DAC 250 inputs to buffer the N−1 switching signals for the DAC 250 and improve transition delays. The sequencer 265 may include N latches to perform sequencing. The buffer system 270 may include N−1 latches to perform buffering. The latch in the sequencer 265 may have the same architecture with the latch in the buffering system 270. Each latch in the sequencer 265 and buffering system 270 may include a unit circuit. An example of a unit circuit architecture is described in further detail with reference to FIG. 5A.

For example, when the ADC is a 7-bit SAR ADC, the SAR logic circuit 260 may include a sequencer 265 that having 7 unit circuits and a buffer system 270 having 6 unit circuits. As shown in FIG. 2, a unit circuit $U_6$ in the sequencer 265 generates an enabling signal $en_5$ for both unit circuit $U_5$ (for sequencing) and unit circuit $B_4$ (for buffering). Both unit circuit $U_5$ and unit circuit $B_4$ receive outputs (e.g., $V_{cp5}$, $V_{cn5}$) from the same comparator in the comparator system 255. Thus, the sequencing and buffering may be performed in parallel rather than in series, and the delay path in the SAR logic 260 may be composed of one single logic delay (e.g., delay $\Delta t_{buf}$ for buffering or delay $\Delta t_{FSM}$ for sequencing) rather than a total delay being the sum of the two logic delays (e.g., $\Delta t_{buf}$ and $\Delta t_{FSM}$). Thus, time to convert an input signal into a digital signal may be advantageously decreased.

Figure 3:
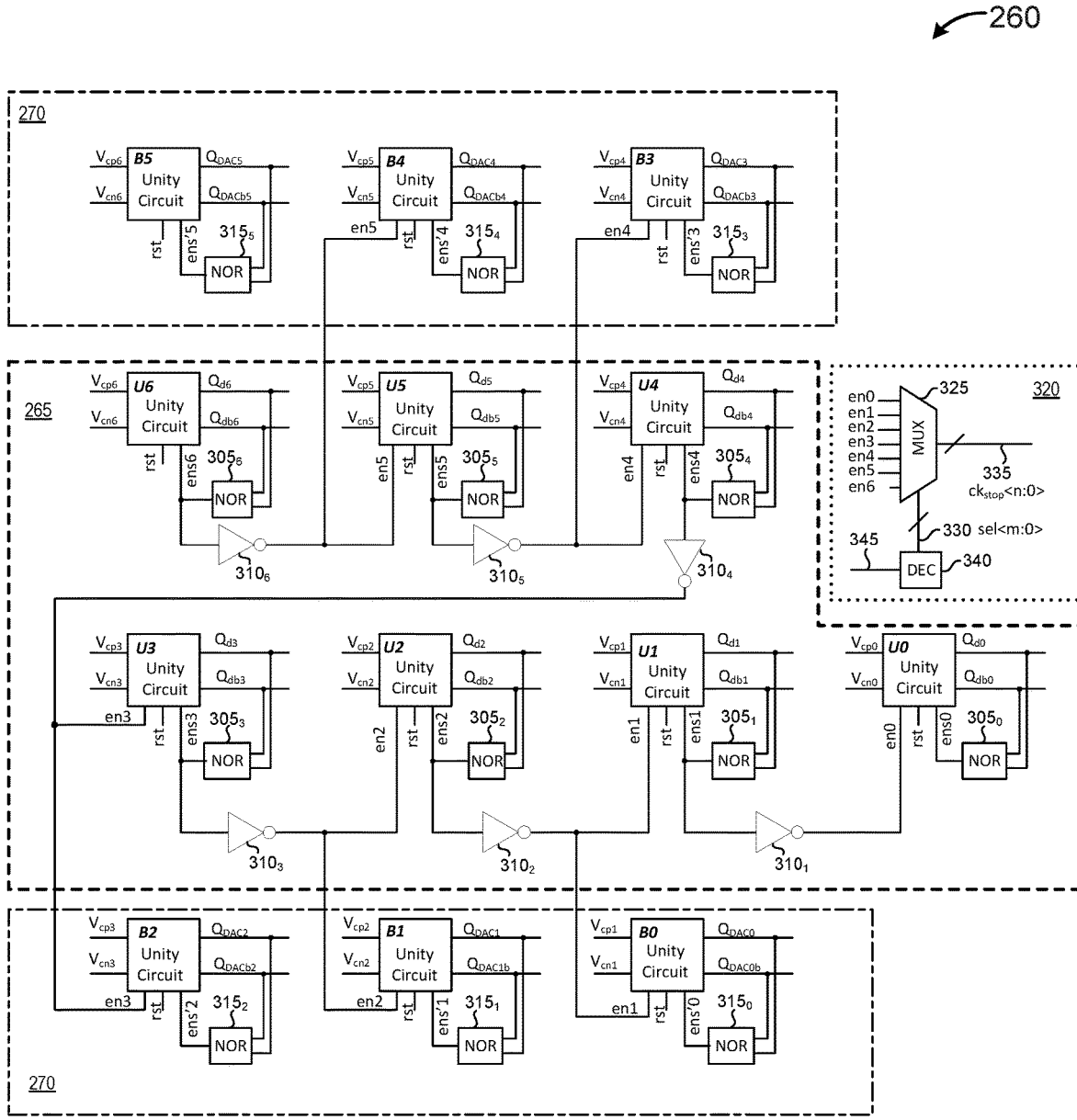
FIG. 3 depicts an architecture of the exemplary SAR logic circuit.

FIG. 3 depicts an architecture of the exemplary SAR logic circuit. A SAR logic circuit (e.g., the SAR logic circuit 260) for an N-bit SAR ADC is described. The SAR logic circuit 260 may perform a binary search. The SAR logic circuit 260 includes a sequencer 265 (e.g., a finite state machine) and the sequencer 265 includes N unit circuits. In this depicted example, the sequencer 265 includes seven unit circuits $U_6$, $U_5$, $U_4$, $U_3$, $U_2$, $U_1$, and $U_0$. An $i^{th}$ unit circuit in the sequencer 265 receives a, for example, a differential comparison signal $V_{cpi}$ and $V_{cni}$ (e.g., $V_{cp7}$ and $V_{cn7}$, $V_{cp6}$ and $V_{cn6}$, $V_{cp5}$ and $V_{cn5}$, $V_{cp4}$ and $V_{cn4}$, $V_{cp3}$ and $V_{cn3}$, $V_{cp2}$ and $V_{cn2}$, $V_{cp1}$ and $V_{cn1}$, $V_{cp0}$ and $V_{cn0}$) from one or more comparators in the comparator system 255. Each of the unit circuit in the sequencer 265 generates a differential output signal $Q_{di}$ and $Q_{dbi}$ (e.g., $Q_{d7}$ and $Q_{db7}$, $Q_{d6}$ and $Q_{db6}$, $Q_{d5}$ and $Q_{db5}$, $Q_{d4}$ and $Q_{db4}$, $Q_{d3}$ and $Q_{db3}$, $Q_{d2}$ and $Q_{db2}$, $Q_{d1}$ and $Q_{db1}$, $Q_{d0}$ and $Q_{db0}$) as a bit output code of analog-to-digital conversion.

The sequencer 265 also includes N NOR gates. In this depicted example, the sequencer 265 includes seven NOR gates $305_6$, $305_5$, $305_4$, $305_3$, $305_2$, $305_1$, and $305_0$. Each of the seven NOR gates receives the corresponding differential comparison signal (e.g., $V_{cp7}$ and $V_{cn7}$, $V_{cp6}$ and $V_{cn6}$, $V_{cp5}$ and $V_{cn5}$, $V_{cp4}$ and $V_{cn4}$, $V_{cp3}$ and $V_{cn3}$, $V_{cp2}$ and $V_{cn2}$, $V_{cp1}$ and $V_{cn1}$, $V_{cp0}$ and $V_{cn0}$) from one or more comparators in the comparator system 255. The seven NOR gates $305_6$, $305_5$, $305_4$, $305_3$, $305_2$, $305_1$, $305_0$ in the sequencer 265 may be used to monitor a status change of the corresponding differential comparison signal $V_{cpi}$ and $V_{cni}$, and then, generate a corresponding stop enabling signal $ens_i$ ($ens_6$, $ens_5$, $ens_4$, $ens_3$, $ens_2$, $ens_1$, $ens_0$) to disable the $i^{th}$ unit circuit in the sequencer 265.

On each conversion cycle, only one comparator in the comparator system 255 may be enabled, thus, only one unit circuit (e.g., $U_6$, $U_5$, $U_4$, $U_3$, $U_2$, $U_1$, $U_0$) in the sequencer 265 will be enabled, and the rest unit circuits in the sequencer 265 will be disabled. For example, before each conversion cycle, every unit circuit may be reset by a same reset signal during the time the ADC 225 is tracking input voltage, and the corresponding differential comparison signal $V_{cpi}$ and $V_{cni}$ may be both at digital low (e.g., digital 0). Each of NOR gate $305_6$, $305_5$, $305_4$, $305_3$, $305_2$, $305_1$, $305_0$ may then set the stop enabling signal $ens_i$ to digital high (e.g., digital 1). During or after one conversion, when the reset is gone, each unit circuit may be waiting for comparator decision and then passing the decision to differential output $Q_{di}$ and $Q_{dbi}$. For example, during or after one conversion of the comparator that connected to the unit circuit $U_6$, at least one of the $Q_{d6}$ and $Q_{db6}$ may become digital high (e.g., digital 1), thus, the NOR gate $305_6$ may make the $ens_6$ digital low (e.g., digital 0) to disable unit circuit $U_6$.

The sequencer 265 also includes N−1 inversion circuits. Each of the N−1 inversion circuits is connected to the output of a corresponding unit circuit $U_i$ to generate a corresponding enabling signal $en_{i-1}$ for a next unit circuit $U_{i-1}$ in the sequencer 265. In this depicted example, the sequencer 265 includes six inversion circuits $310_6$, $310_5$, $310_4$, $310_3$, $310_2$, $310_1$, each of the six inversion circuits is connected to the output of a corresponding unit circuit $U_i$ (e.g., $U_6$, $U_5$, $U_4$, $U_3$, $U_2$, $U_1$) to generate a corresponding enabling signal $en_{i-1}$ (e.g., $e_5$, $e_4$, $e_3$, $e_2$, $e_1$, $e_0$) for a next unit circuit in the sequencer 265. For example, a sixth inversion circuit $310_6$ receives the sixth stop enabling signal $ens_6$ to generate a fifth enabling signal $en_5$ for the fifth unit circuit $U_5$ in the sequencer 265. When the sixth stop enabling signal $ens_6$ is at digital high, the sixth inversion circuit $310_6$ may generate a digital low enabling signal $en_5$, which will not enable the fifth unit circuit $U_5$. When the sixth stop enabling signal $ens_6$ is at digital low, the sixth inversion circuit $310_6$ may generate a digital high enabling signal $en_5$, which will enable the fifth unit circuit $U_5$ in the sequencer 265. In some embodiments, each of the inversion circuits $310_6$, $310_5$, $310_4$, $310_3$, $310_2$, $310_1$ may include one or more inverters, for example, one inverter, three invertors.

The SAR logic circuit 260 also includes a buffering system 270 arranged between the comparator system 255 outputs and the DAC 250 inputs to buffer the N−1 switching signals ($Q_{DACn-2}$, . . . , $Q_{DAC0}$) for the DAC 250 and improve transition delays. The buffering system 270 includes N−1 unit circuits to generate the N−1 switching signals. For example, the buffering system 270 includes six unit circuits $B_5$, $B_4$, $B_3$, $B_2$, $B_1$, $B_0$ to generate the switching signals $Q_{DAC5}$, $Q_{DAC4}$, $Q_{DAC3}$, $Q_{DAC2}$, $Q_{DAC1}$, $Q_{DAC0}$.

Each of the unit circuit in the buffering system 270 may have the same architecture with the unit circuit in the sequencer 265. Each of the $(i-1)^{th}$ unit circuit in the buffering system 270 may receive the same differential comparison signal $V_{cpi}$ and $V_{cni}$ with the $i^{th}$ unit circuit in the sequencer 265. The $i^{th}$ unit circuit in the sequencer 265 may generate an $i^{th}$ enabling signal ($en_i$) for both an $(i-1)^{th}$ unit circuit in the sequencer 265 and an $(i-2)^{th}$ unit circuit in the buffering system 270. As the $(i-1)^{th}$ unit circuit in the sequencer 265 and an $(i-2)^{th}$ unit circuit in the buffering system 270 are enabled at the same time, propagation delays in the SAR logic circuit 260 may be advantageously reduced by performing sequencing and buffering in parallel.

For example, the fifth unit circuit $B_5$ in the buffering system 270 and the sixth unit circuit $U_6$ in the sequencer 265 receive the same differential comparison signal $V_{cp6}$ and $V_{cn6}$. The sixth unit circuit $U_6$ in the sequencer 265 generates the enabling signal $en_5$ for both the fifth unit circuit $U_5$ in the sequencer 265 and the fourth unit circuit $B_4$ in the buffering system 270. Thus, $U_5$ and $B_4$ are operated in parallel, which may advantageously reduce propagation delays in the SAR logic circuit 260.

The buffering system 270 also includes N−1 NOR gates. In this depicted example, the buffering system 270 includes six NOR gates $305_5$, $305_4$, $305_3$, $305_2$, $305_1$, $305_0$. Each of the six NOR gates receives the corresponding differential comparison signal $V_{cpi}$ and $V_{cni}$ (e.g., $V_{cp6}$ and $V_{cn6}$, $V_{cp5}$ and $V_{cn5}$, $V_{cp4}$ and $V_{cn4}$, $V_{cp3}$ and $V_{cn3}$, $V_{cp2}$ and $V_{cn2}$, $V_{cp1}$ and $V_{cn1}$) from the comparator system 255. A NOR gate $315_{i-1}$ (e.g., $315_5$, $315_4$, $315_3$, $315_2$, $315_1$, $315_0$) in the buffering system are used to monitor a change of a corresponding differential comparison signal $V_{cpi}$ and $V_{cni}$, and then, generate a corresponding stop enabling signal $ens'_{i-1}$ ($ens'_5$, $ens'_4$, $ens'_3$, $ens'_2$, $ens'_1$, $ens'_0$) to disable the unit circuit $315_0$ in the buffering system 270, N−1≥i≥0.

Although in this depicted example, NOR gates $305_6$-$305_0$ and NOR gates $315_5$-$315_0$ are used in the sequencer 265 and the buffering system 270 to detect the change of the outputs $Q_{di}$, $Q_{dbi}$, and outputs $Q_{DACi}$, $Q_{DACbi}$, in some embodiments, exclusive OR (XOR) gates may be used to replace the NOR gates. The XOR may be used when the comparator tends to operate in metastable mode and there is a risk of both outputs rising simultaneously (and disabling the unit circuit before a valid decision is achieved). For example, $Q_{di}$, $Q_{dbi}$ may be forced to 0 at the beginning. For a NOR gate, when there is a change at the output $Q_{di}$, $Q_{dbi}$ (e.g., either $Q_{di}$ or $Q_{dbi}$ become 1), the output of a NOR gate may change from 1 to 0. If the NOR gate is replaced by an XOR gate, the output of the XOR gate may change from 0 to 1. An inversion circuit may be placed between the $i^{th}$ XOR gate and the $i^{th}$ unit circuit to invert the $i^{th}$ XOR output to disable the $i^{th}$ unit circuit, the $i^{th}$ XOR output may be used to enable the $(i-1)^{th}$ unit circuit in the sequencer 265 and the $(i-2)^{th}$ unit circuit in the buffering system 270.

The SAR logic circuit 260 may be used to support two to N comparators in the comparator system 255 on each conversion cycle. When the comparator system 255 includes N comparators, each of the unit circuit in the sequencer 265 may be connected to a predetermined corresponding comparator to receive comparator outputs ($V_{cpi}$, $V_{cni}$). Each of the N comparators may be triggered to perform a comparison at a rising edge of a corresponding clock signal. The clock generation circuit 245 may be used to generate N clock signals to the N comparators in the comparator system 255.

For example, the comparator system 255 may include two comparators (e.g., a first comparator $C_A$ and a second comparator $C_B$). Unit circuits $U_6$ and $B_5$, unit circuits $U_4$ and $B_3$, unit circuits $U_2$ and $B_1$, and unit circuits $U_0$ may be connected to the first comparator $C_A$. Unit circuits $U_5$ and $B_4$, unit circuits $U_3$ and $B_2$, unit circuits $U_1$ and $B_0$ may be connected to the second comparator $C_B$. At a first rising edge of a first clock signal, the first comparator $C_A$ may be triggered, $U_6$ and $B_5$ may be enabled to store and buffer data for output and to control the DAC 250, respectively. During or after a first comparison cycle, when there is a change at the first comparator's outputs (e.g., $Q_{d6}$ and/or $Q_{db6}$ goes high), $U_6$ may generate a low stop enabling signal $ens_6$ to disable $U_6$. The sixth inversion circuit $310_6$ may then generate a high enable signal $en_5$ to enable $U_5$ and $B_4$. At a first rising edge of a second clock signal, the second comparator $C_B$ may be triggered, $U_5$ and $B_4$ may store and buffer data for output and to control the DAC 250, respectively. When there is a change at the second comparator's outputs (e.g., $Q_{d5}$ and/or $Q_{db5}$ goes high), $U_5$ may generate a low stop enabling signal $ens_5$ to disable $U_5$. The fifth inversion circuit $310_5$ may then generate a high enable signal $en_5$ to enable $U_4$ and $B_3$. At a second rising edge of the first clock signal, the first comparator $C_A$ may be triggered, $U_4$ and $B_3$ may store and buffer data for output and to control the DAC 250, respectively. Exemplary timing diagrams of the enabling signals and clock signals for the two comparators are described in further detail with reference to FIG. 4.

The comparator system 255 having up to N comparators may be programmed to obtain different resolutions. For example, for a 4-bit ADC, the comparator system 255 may be programmed to enable four comparators. To support up to N comparators, the SAR logic circuit 260 may include a selection circuit 320. The selection circuit 320 includes an N-input selector 325 (e.g., a 7-input multiplexer) to receive N enabling signals (e.g., $en_{n-1}, \ldots, en_0$) from N unit circuits in the sequencer 265. The multiplexer may be used to generate stop signals for up to "n" comparator clocks. For example, the selector 325 is controlled by a selection signal 330. The selection signal 330 is used to select among the N enabling signals ($en_{n-1}, \ldots, en_0$) to generate an output enabling signal 335 as a stop clock signal to stop the clock on one or more predetermined comparators in the comparator system 255.

The selection circuit 320 also includes a decoding circuit 340 (e.g., a decoder) to receive a command signal 345 and generate the selection signal 330. The command signal 345 may be provided by a circuit designer, a processor, a controller. For example, and a user may want to use five comparators in the comparator system 255 to support a 5-bit ADC. The decoding circuit 340 receives the command signal and generates the selection signal 330 to select $en_2$ as the stop clock signal to stop the operation of all comparators in the comparator system after 5 cycles. And the ADC may resolve 5 bits. The decoding circuit 340 converts the binary input signal into "m" selection lines, used to control the selector 325, "m" is the number of switches used inside the selector 325, and m may be greater than or equal to N.

Figure 4:
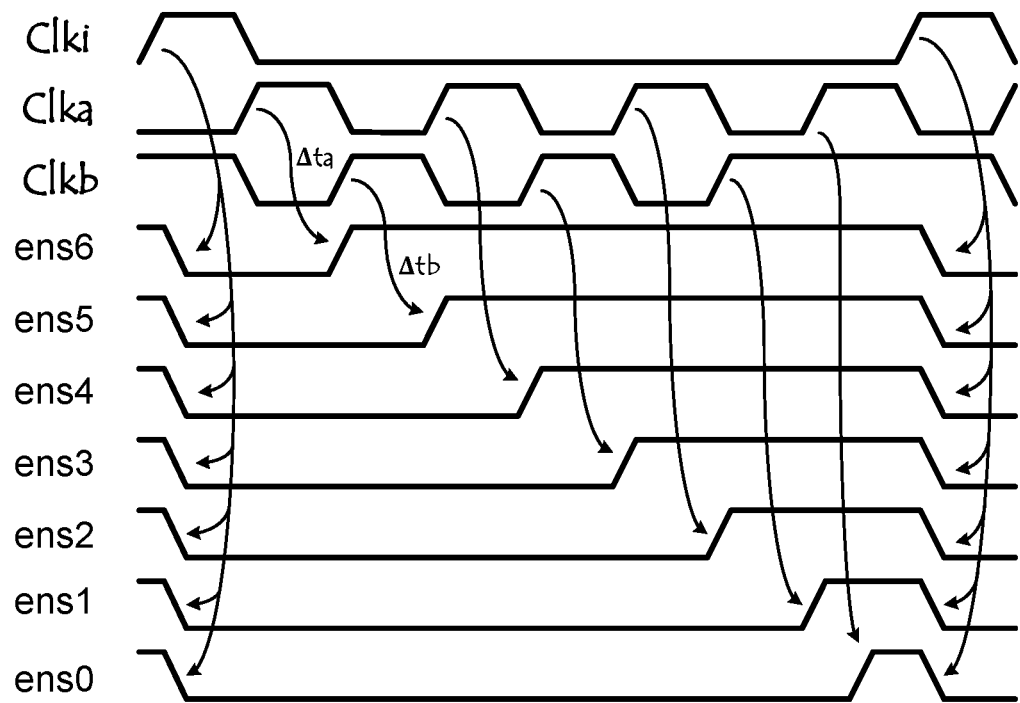
FIG. 4 depicts timing diagrams of exemplary clock signals and enabling signals used in the SAR ADC.

FIG. 4 depicts timing diagrams of exemplary clock signals and enabling signals used in the SAR ADC. In this depicted example, the comparator system 255 includes two comparators $C_A$ and $C_B$. $Clk_i$ is the reset signal used by the unit circuits in FIG. 3. A first comparator $C_A$ is controlled by a first clock signal $clk_a$, and a second comparator $C_B$ is controlled by a second clock signal $clk_b$. The second clock signal $clk_b$ has the same frequency with the first clock signal $clk_a$, and the phase difference between the first clock signal $clk_a$ and the second clock signal $clk_b$ is 180 degrees.

At the rising edge of the reset signal $clk_i$, all unit circuits are disabled by their corresponding digital low stop enabling signals $ens_6$-$ens_0$. At the rising edge of the first clock signal $clk_a$, the first comparator $C_A$ may be triggered to perform a comparison. After a first period $\Delta t_a$, for a 7-bit SAR logic circuit (e.g., SAR logic circuit 260), unit circuit $U_6$ and $B_5$ may receive the comparison result of the first comparator $C_A$, and the NOR gate $305_6$ (shown in FIG. 3) makes the low stop enabling signal $ens_6$ of unit circuit $U_6$ and $B_5$ become digital high and also enable unit circuit $U_5$ and $B_4$ to receive a next comparison result. $\Delta t_a$ may indicate delay between the rising edge of $clk_a$ and the rising edge of a next digital high $en_5$. In some embodiments, $\Delta t_a$ may be equal to a time period that the first comparator $C_A$ may need to finish the comparison. At the falling edge of first clock signal $clk_a$ (also the rising edge of the second clock signal $clk_b$), the first comparator $C_A$ may be disabled, and the second comparator $C_B$ may be triggered to perform a comparison. After a second period $\Delta t_b$, unit circuit $U_5$ and $B_4$ may receive the comparison result from the second comparator $C_B$ and the NOR gate $305_5$ (shown in FIG. 3) makes the low stop enabling signal $ens_5$ of unit circuit $U_6$ and $B_5$ become digital high. $\Delta t_b$ may indicate delay between the rising edge of $clk_b$ and the rising edge of a next digital high $en_5$. In some embodiments, $\Delta t_b$ may be equal to a time period that the second comparator $C_B$ may need to finish the comparison.

The first comparator $C_A$ and the second comparator $C_B$ may be enabled and disabled periodically, and unit circuits for buffering or storing in the SAR logic may be enabled one by one. The enable signals $en_5$-$en_0$ are generated in sequence and are indications of how many SA cycles have been performed at a give instance during a conversion cycle, which may be used to introduce resolution configurability to the SAR logic. For example, if the clock generation circuit 245 is designed to stop a certain comparator clock after a corresponding stop signal (e.g., stop signal 335) falls from high to low, the $en_5$-$en_0$ signals may be used as stop signals, and the resolution may be defined by selecting which enable signal is sent to the clock generation circuit 245 on each conversion cycle.

In some embodiments, for a 7-bit SAR logic circuit (e.g., SAR logic circuit 260), if $en_3$ is used to stop clock signal $clk_a$ and $clk_b$, the ADC may resolve only 4 bits. If $en_0$ is used to stop clock signal $clk_a$ and $clk_b$, the ADC may resolve 7 bits. As the enabling signal $en_i$ (e.g., $en_5$-$en_0$) are used to enable both unit circuits in the sequencer 265 and the buffering system 270 at the same time, propagation delays in the SAR logic circuit 260 may be advantageously reduced by performing sequencing and buffering in parallel.

Figures 5A, 5B:
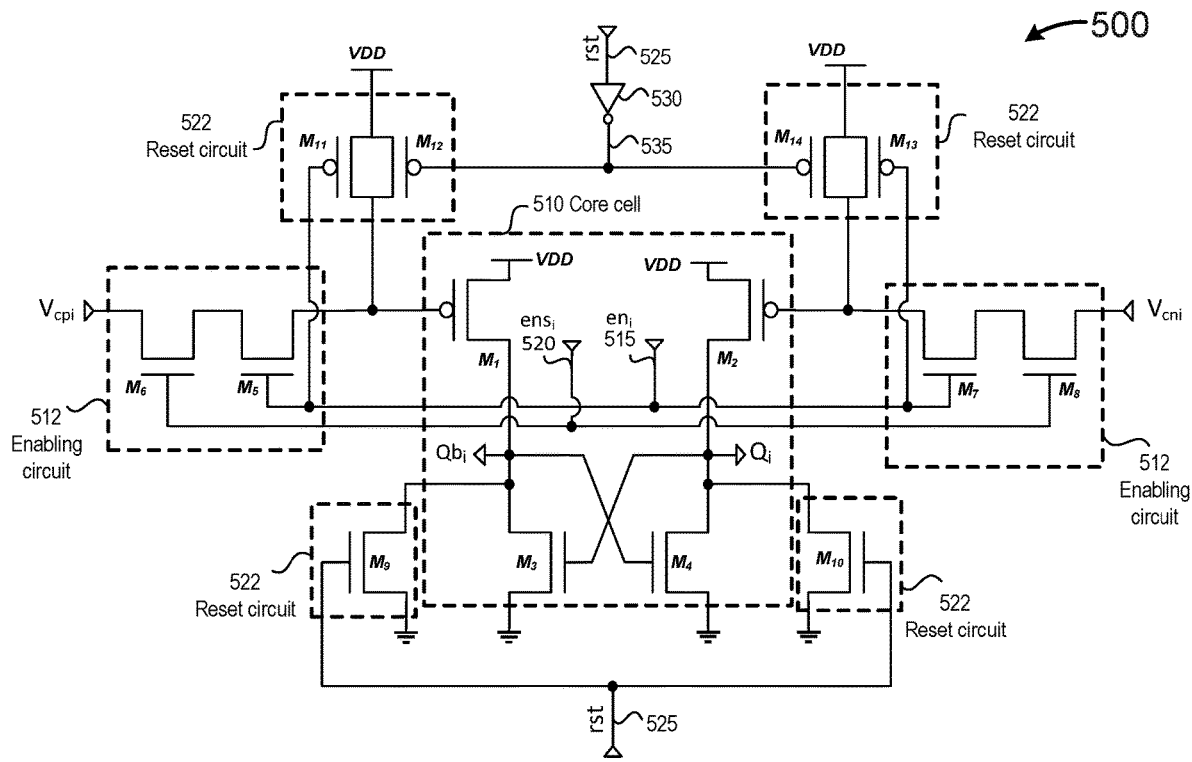
FIG. 5A depicts an architecture of an exemplary unit circuit in the SAR logic circuit.
FIG. 5B depicts a truth table of the exemplary unit circuit.

FIG. 5A depicts an architecture of an exemplary unit circuit in the SAR logic circuit. In this depicted example, a unit circuit (e.g., $U_6$-$U_0$, $B_5$-$B_0$) 500 includes a core cell 510. The core cell 510 includes a first transistor $M_1$. In this depicted example, the first transistor $M_1$ is a P-type metal-oxide-semiconductor field-effect-transistor (PMOSFET). The gate terminal of the first transistor $M_1$ is coupled to receive a first differential comparison decision signal $V_{cpi}$, and the source terminal of the first transistor $M_1$ is coupled to a predetermined power supply $V_{DD}$. The core cell 510 also includes a second transistor $M_2$. In this depicted example, the second transistor $M_2$ is also a PMOSFET. The gate terminal of the second transistor $M_2$ is coupled to receive a second differential comparison decision signal $V_{cni}$, and the source terminal is also coupled to the predetermined power supply $V_{DD}$.

The core cell 510 also includes a third transistor $M_3$. In this depicted example, the third transistor $M_3$ is an N-type MOSFET (NMOS). The drain terminal of the third transistor $M_3$ is coupled to the drain terminal of the first transistor $M_1$, and the source terminal of the third transistor $M_3$ is coupled to a predetermined reference voltage (e.g., ground potential). The core cell 510 also includes a fourth transistor $M_4$. In this depicted example, the fourth transistor $M_4$ is also an NMOSFET. The drain terminal of the fourth transistor $M_4$ is coupled to the drain terminal of the second transistor $M_2$, and the source terminal of the fourth transistor $M_4$ is also coupled to the predetermined reference voltage (e.g., ground potential). The gate terminals of the third transistor $M_3$ and the fourth transistor $M_4$ are cross-coupled to the drain terminals of the fourth transistor $M_4$ and the third transistor $M_3$. The outputs of the core cell 510 are the signals at the drain terminals of the fourth transistor $M_4$ and the third transistor $M_3$ and may be expressed as $Q_i$ (e.g., $Q_{di}$, $Q_{DACi}$ in FIG. 3) and $Q_{bi}$ (e.g., $Q_{dbi}$, $Q_{DACbi}$ in FIG. 3), respectively.

In this illustrated structure, assuming $Q_i$ and $Q_{bi}$ are initially low. When a positive differential voltage ($V_{cpi}$>$V_{cni}$) is applied at the inputs (gate terminals of $M_1$ and $M_2$), transistor $M_1$ and transistor $M_4$ may be OFF or weakly ON, and transistor $M_2$ and transistor $M_3$ may be fully ON. Then, the output $Q_i$ may rise from, for example, a digital low (e.g., 0) to a digital high (e.g., 1), and the output $Q_{bi}$ may stay low. If a negative differential voltage ($V_{cpi}$<$V_{cni}$) is applied at the inputs (gate terminals of $M_1$ and $M_2$), transistor $M_2$ and transistor $M_3$ may be OFF or weakly ON, and transistor $M_1$ and transistor $M_4$ may be fully ON. Then, the output $Q_{bi}$ may rise from, for example, a digital low (e.g., 0) to a digital high (e.g., 1), and the output $Q_i$ may stay low.

The unit circuit 500 also includes an enabling circuit 512. In this depicted example, the enabling circuit 512 includes transistors $M_5$, $M_6$, $M_7$, $M_8$ to enable or disable the core cell 510. In this depicted example, transistors $M_5$, $M_6$, $M_7$, $M_8$ are NMOSFETs. The transistor $M_5$ and the transistor $M_6$ are connected in series. The source terminal of $M_5$ is connected with the gate terminal of the transistor $M_1$. The drain terminal of $M_6$ is coupled to receive the first differential comparison signal $V_{cpi}$. The transistor $M_7$ and the transistor $M_8$ are connected in series. The source terminal of $M_7$ is connected to the gate terminal of the transistor $M_2$. The drain terminal of $M_8$ is coupled to receive the second differential comparison signal $V_{cni}$. The gate terminals of $M_5$ and $M_7$ are controlled by an enabling signal 515 (e.g., $en_6$-$en_0$), and the gate terminals of $M_6$ and $M_8$ are controlled by a stop enabling signal 520 (e.g., $ens_6$-$ens_0$). Enabling signal $en_6$ may be the inversed version of the reset signal. The stop enabling signal 520 may be used to force the core cell 510 to hold its stage after one of the outputs ($Q_i$, $Q_{bi}$) has changed. A status change of the outputs may be detected by a NOR gate (e.g., NOR gates $305_6$-$305_0$ in FIG. 3) to generate the disabling signal.

The unit circuit 500 also includes a reset circuit 522. In this depicted example, the reset circuit 522 includes transistors $M_9$, $M_{10}$, $M_{11}$, $M_{12}$, $M_{13}$, $M_{14}$ to reset the transistors $M_1$-$M_4$ in the core cell 510 to obtain the initially low outputs $Q_i$ and $Q_{bi}$. The transistors $M_9$-$M_{10}$, in this depicted example, are NMOSFETs. The transistor $M_9$ is connected with the transistor $M_3$ in parallel, with the drain terminal of $M_9$ is connected to the drain terminal of $M_3$. The transistor $M_{10}$ is connected with the transistor $M_4$ in parallel, with the drain terminal of $M_{10}$ is connected to the drain terminal of $M_4$. The gate terminals of $M_9$ and $M_{10}$ are controlled by a reset signal 525. In this depicted example, the transistors $M_{11}$-$M_{14}$ are PMOSFETs. The source terminals of transistors $M_{11}$-$M_{14}$ are connected to the predetermined power supply $V_{DD}$. The drain terminals of $M_{11}$ and $M_{12}$ are connected to the gate terminal of transistor $M_1$, and the drain terminals of $M_{13}$ and $M_{14}$ are connected to the gate terminal of transistor $M_2$. The gate terminals of $M_{11}$ and $M_{13}$ are also controlled by the enabling signal 515. The gate terminals of $M_{12}$ and $M_{14}$ are controlled by an inverted reset signal 535. An inversion circuit 530 may be used to invert the reset signal 525 to obtain the inverted reset signal 535. The inversion circuit 530 may include one or more inverters.

When the enabling signal 515 is low, transistors $M_5$ and $M_7$ will be off, and transistors $M_{11}$ and $M_{13}$ will be on, transistors $M_1$ and $M_2$ will be off, and the outputs ($Q_i$, $Q_{bi}$) may decay towards low voltage. If the enabling signal 515 is high and the stop enabling signal 520 is low, transistors $M_5$ and $M_7$ will be on, transistors $M_6$, $M_8$, $M_{11}$, and $M_{13}$ will be off, and the voltages at the gate terminals of $M_1$ and $M_2$ may be preserved and the voltages at the outputs ($Q_i$, $Q_{bi}$) may be held constant. An exemplary method to operate the unit circuit 500 is described in further detail with reference to FIG. 7.

In some embodiments, the sizes of each transistor $M_1$-$M_{14}$ may be different. For example, the size of the transistor $M_3$ may be equal to the size of transistor $M_4$. The size of each transistor $M_1$-$M_2$ may be four times the size of transistor $M_3$. The size of each transistor $M_5$-$M_8$ may be three times the size of the transistor $M_3$. The size of each transistor $M_9$-$M_{10}$ may be two times the size of the transistor $M_3$. The size of each transistor $M_{11}$-$M_{14}$ may be equal to the size of the transistor $M_3$.

In some embodiments, input capacitances of unit circuits, connected to each comparator, may be variable and dependent on the state of the enabling signal 515 and stop enabling signal 520. When both the enabling signal 515 and the stop enabling signal 520 are digital low (e.g., 0), the input capacitance $C_{in}$ of the unit circuit 500 may be expressed as $C_{in}$=$C_{jM6}$, $C_{jM6}$ is the junction capacitance of the transistor $M_6$. When both the enabling signal 515 and the stop enabling signal 529 are digital high (e.g., 1), the unit circuit 500 is fully enabled, and the input capacitance $C_{in}$ of the unit circuit 500 may be expressed as $C_{in}$=$C_{jM6}$+$C_{jM5}$+$C_{par}$+$C_{gM1}$, $C_{jM6}$ is the junction capacitance of the transistor $M_6$, $C_{jM5}$ is the junction capacitance of the transistor $M_5$, $C_{par}$ is the parasitic capacitance of the unit circuit 500 (e.g., parasitic capacitance of wires), $C_{gM1}$ is the gate capacitance of the transistor $M_1$. Thus, the unit circuit input capacitance may be strongly reduced when a unit circuit is disabled.

As the SAR logic circuit 260 includes a number of unit circuits (e.g., $U_6$-$U_0$, $B_5$-$B_0$), at each conversion cycle, only one unit circuit in the sequencer 265 and at most one unit circuit in the buffering system 260 are enabled, the input capacitance of the SAR logic circuit 260 may be variable with the bit being decoded by the SAR logic as different unit circuits are selectively enabled. Even when the same comparator output is connected to multiple unit circuits in the sequencer 265 and buffering system 270, the comparator output may be effectively loaded only by a single unit circuit in the sequencer 265 and a single unit circuit in the buffering system 270 in each SA cycle. In addition, each of the comparators in the comparator system 255 may only need to drive a small capacitance as most of the parasitic capacitances are present only when the unit circuit is enabled.

Although in this depicted example, some transistors are PMOSFETs and some transistors are NMOSFETs, in other embodiments, if the comparator output voltage polarities are inversed, a similar circuit may be obtained with the same functionality, if all PMOSFETs are replaced by NMOSFETs, and all NMOSFETs are replaced by PMOSFETs.

FIG. 5B depicts a truth table of the exemplary unit circuit. The relationship reset signal, stop enabling signal, enabling signal and outputs $Q_i$ and $Q_{bi}$ are shown in the table. When the reset signal is 1, the output $Q_i$ and $Q_{bi}$ are 0. When the reset signal is 0, the stop enabling signal is 1, and the enabling signal is 1, the inputs voltages of the unit circuit are preserved, and each of the outputs $Q_i$ and $Q_{bi}$ may have a corresponding input value $V_{cni}$ and $V_{cpi}$. $V_{cni}^{-1}$ is the previous value on the comparator negative output and $V_{cpi}^{-1}$ is the previous value on the comparator positive output.

Figure 6:
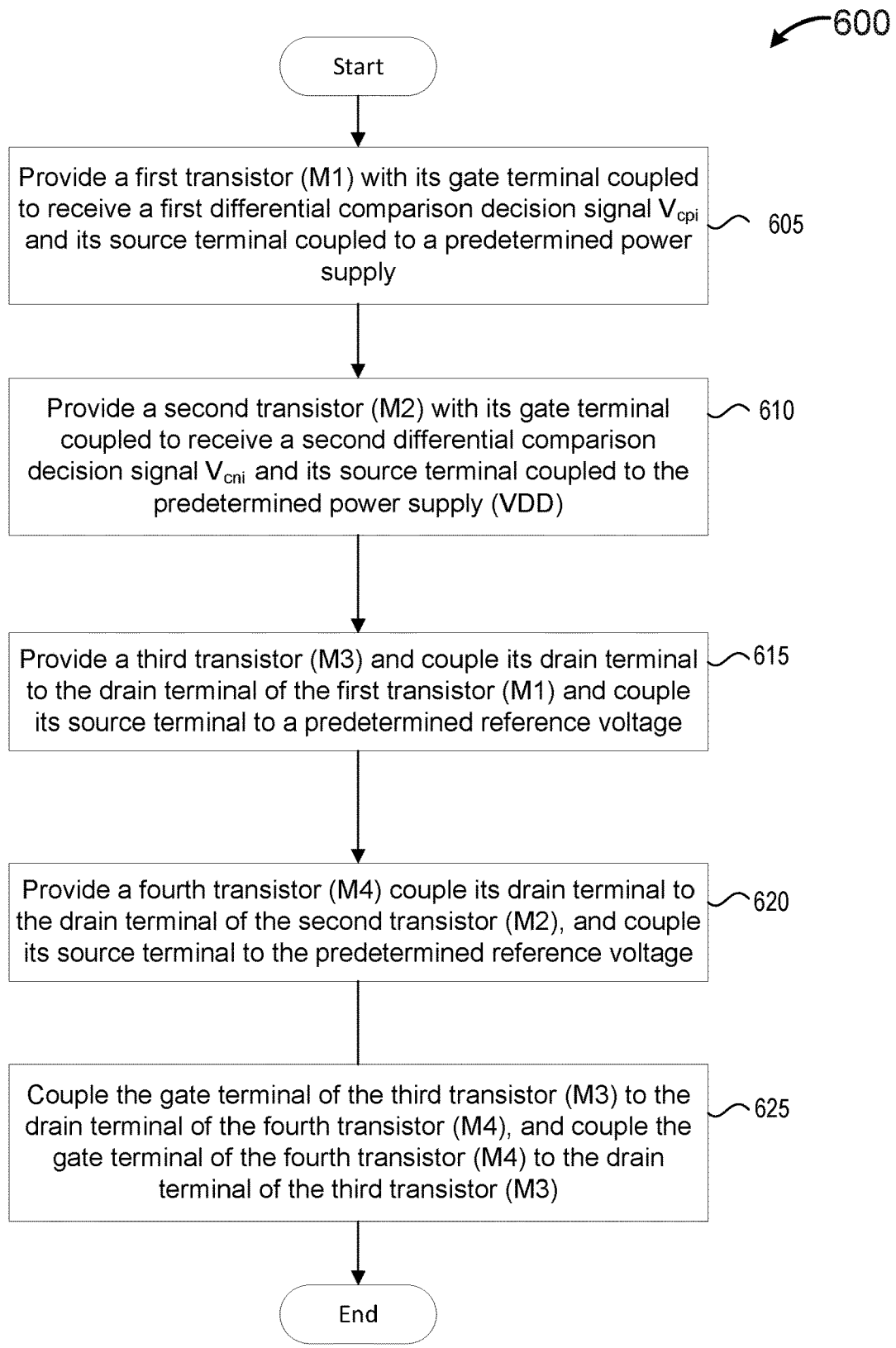
FIG. 6 depicts a flow chart of an exemplary method to implement a unit circuit.

FIG. 6 depicts a flow chart of an exemplary method to implement a unit circuit. A method 600 is discussed to implement the unit circuit 500 as shown in FIG. 5A. The method 600 includes, at 605, providing a first transistor (e.g., transistor $M_1$) with the gate terminal of the first transistor $M_1$ coupled to receive a first differential comparison decision signal $V_{cpi}$ and the source terminal the first transistor $M_1$ coupled to a predetermined power supply (e.g., $V_{DD}$). The method 600 also includes, at 610, providing a second transistor (e.g., transistor $M_2$) with the gate terminal of the second transistor $M_2$ coupled to receive a second differential comparison decision signal $V_{cni}$ and its source terminal coupled to the predetermined power supply $V_{DD}$.

The method 600 also includes, at 615, providing a third transistor (e.g., transistor $M_3$) and coupling the drain terminal of the third transistor $M_3$ to the drain terminal of the first transistor $M_1$, and coupling the source terminal of the third transistor $M_3$ to a predetermined reference voltage (e.g., ground potential). The method 600 also includes, at 620, providing a fourth transistor (e.g., transistor $M_4$), and, coupling the drain terminal of the fourth transistor $M_4$ to the drain terminal of the second transistor $M_2$, and coupling the source terminal of the fourth transistor $M_4$ to the predetermined reference voltage. The method 600 also includes, at 625, coupling the gate terminal of the third transistor $M_3$ coupled to the drain terminal of the fourth transistor $M_4$, and coupling the gate terminal of the fourth transistor $M_4$ to the drain terminal of the third transistor $M_3$.

In some embodiments, to implement the unit circuit (e.g., the unit circuit 500) shown in FIG. 5, the method may also include providing enabling circuit (e.g., enabling circuit 512) and/or reset circuit (e.g., reset circuit 522) to form different structures of a unit circuit. For example, the method may include providing a fifth transistor (e.g., the transistor $M_5$), and coupling the source terminal of the fifth transistor $M_5$ to the gate terminal of the first transistor $M_1$ and coupling the gate terminal of the fifth transistor $M_5$ to an enabling signal (e.g., the enabling signal 515). The method may include providing a sixth transistor (e.g., the transistor $M_6$) and connecting the sixth transistor $M_6$ to the fifth transistor $M_5$ in series. The sixth drain terminal of the sixth transistor $M_6$ may be coupled to receive the first differential comparison decision signal $V_{cpi}$, and the gate terminal of the sixth transistor $M_6$ may be controlled by a stop enabling signal (e.g., the stop enabling signal 520).

The method may also include providing a seventh transistor (e.g., the transistor $M_7$). The source terminal of the seventh transistor $M_7$ may be coupled to the gate terminal of the second transistor $M_2$, the gate terminal of the seventh transistor $M_7$ may be controlled by the enabling signal 515. The method may also include providing an eighth transistor (e.g., the transistor $M_8$), and connecting the eighth transistor $M_8$ to the seventh transistor $M_7$ in series. The drain terminal of the eighth transistor $M_8$ may be coupled to receive the second differential comparison decision signal $V_{cni}$, and the gate terminal of the eighth transistor $M_8$ may be controlled by the stop enabling signal 520. In some embodiments, the method may also include providing transistor $M_9$-$M_{14}$ to reset the core cell 510. By controlling the reset signal, enable signal and monitoring outputs status of the unit circuit 500, the unit circuit 500 may be reset, enabled or disabled, and input capacitances of the unit circuit may be changed and dependent on the state of the enabling signal and stop enabling signal.

Figure 7:
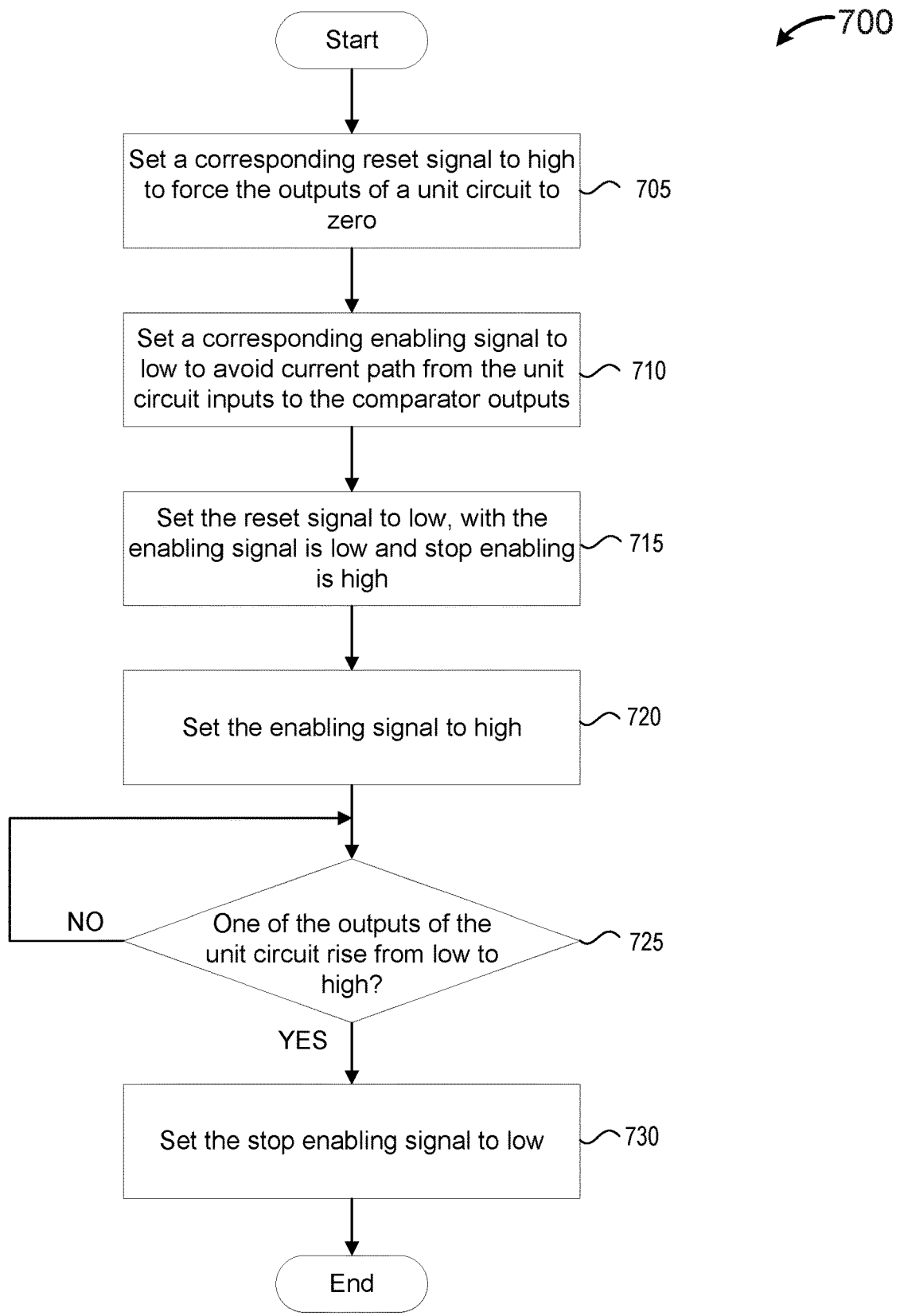
FIG. 7 depicts a flow chart of an exemplary method to operate the unit circuit.

FIG. 7 depicts a flow chart of an exemplary method to operate the unit circuit. An exemplary method 700 represents operations performed by the unit circuit 500 in FIG. 5A. The method 700 to operate a unit circuit includes, at 705, setting a corresponding reset signal (e.g., reset signal 525) to high (e.g., digital 1) to force the outputs (e.g., outputs $Q_i$ and $Q_{bi}$) of a unit circuit (e.g., the unity circuit 500) to zero. The method 700 also includes, at 710, setting a corresponding enabling signal (e.g., enabling signal $en_i$ 515) to low (e.g., digital 0) to avoid current path from the unit circuit 500 inputs (e.g., $V_{cpi}$, $V_{cni}$) to comparator outputs (e.g., $V_{cpi}$, $V_{cni}$). The method also includes, at 715, setting the reset signal 525 to low, with the enabling signal $en_i$ 515 is low, and a stop enabling signal (e.g., stop enabling signal $ens_i$ 520) is high.

The method also includes, at 720, setting the enabling signal $en_i$ 515 to high to enable the unit circuit 500. One of the outputs $Q_i$ and $Q_{bi}$ of the unit circuit 500 may rise from low to high, depending on the input polarity. Once, at 725, one of the outputs $Q_i$ and $Q_{bi}$ of the unit circuit 500 rises from low to high, then, at 730, the unit circuit 500 will generate a low stop enabling signal $ens_i$ 520 to disable the unit circuit 500. The charge at transistor $M_1$ and transistor $M_2$ gates may be trapped, and the voltage may be preserved at these nodes. Output voltage (e.g., $V_{cpi}$, $V_{cni}$) may be held until the next reset phase (e.g., reset signal 525 and stop enabling signal $ens_i$ 520 are high, and enabling signal $en_i$ 515 is low).

By resetting, enabling and/or disabling some transistors in the unit circuit 500, the input capacitance $C_{in}$ of the unit circuit 500 may be variable at different modes (e.g., reset mode, enabled mode, or disenabled mode). For example, when both the enabling signal 515 and the stop enabling signal 520 are digital low (e.g., 0), the input capacitance $C_{in}$ of the unit circuit 500 may be expressed as $C_{in}=C_{jM6}$, $C_{jM6}$ is the junction capacitance of the transistor $M_6$. When both the enabling signal 515 and the stop enabling signal 529 are digital high (e.g., 1), the input capacitance $C_{in}$ of the unit circuit 500 may be expressed as $C_{in}=C_{jM6}+C_{jM5}+C_{par}+C_{gM1}$, $C_{jM6}$ is the junction capacitance of the transistor $M_6$, $C_{jM5}$ is the junction capacitance of the transistor $M_5$, $C_{par}$ is the parasitic capacitance of the unit circuit 500 (e.g., parasitic capacitance of wires), $C_{gM1}$ is the gate capacitance of the transistor $M_1$. Thus, each of the comparators in the comparator system 255 may only need to drive a small capacitance as most of the parasitic capacitances are present only when the unit circuit is enabled.

Figure 8:
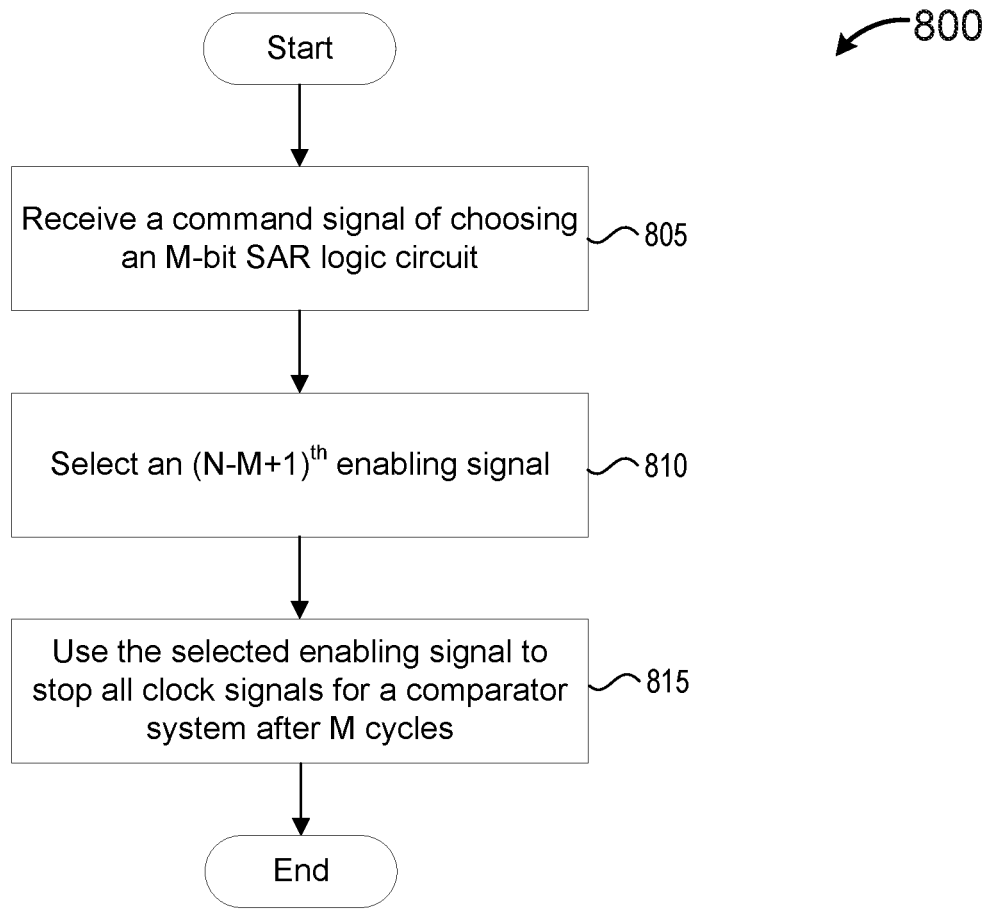
FIG. 8 depicts a flow chart of an exemplary method to program the resolution of the SAR logic circuit.

FIG. 8 depicts a flow chart of an exemplary method to program the resolution of the SAR logic circuit. In this depicted example, a method 800 to program the resolution of the SAR logic circuit 260 in the ADC 255 is discussed. At 805, a command signal (e.g., the command signal 345) of choosing an M-bit SAR logic circuit may be received. For example, a user may decide to build an M-bit SAR ADC by using an M-bit SAR logic circuit. A controller/processor may generate the command signal. A decoder (e.g., the decoder 340) may receive the command signal of choosing an M-bit SAR ADC, N≥M≥0. As the comparator system 255 includes N comparators, some of the comparators will be disabled. At 810, the decoder 340 receives the command signal 345 and generate a selection signal (e.g., the selection signal 330). The selection signal 330 may select one of the N enabling signals as a clock stop signal. For example, to obtain an M-bit ADC, the selection signal 330 may select the $(N-M+1)^{th}$ enabling signal as a clock stop signal. At 815, the $(N-M+1)^{th}$ enabling signal is used to stop all clock signals for the N comparators in the comparator system 255 after M cycles. Thus, an M-bit ADC may be obtained.

For example, the comparator system 255 may include 7 (e.g., N=7) comparators. To obtain a 5-bit ADC (e.g., M=5), the $3^{rd}$ enabling signal $en_2$ may be selected as a stop signal to stop all the 7 comparators after 5 clock cycles. The ADC may resolve 5 bits. By introducing the selection circuit 320, the SAR logic circuit 260 may be able to support up to N bits comparator system.

Figure 9:
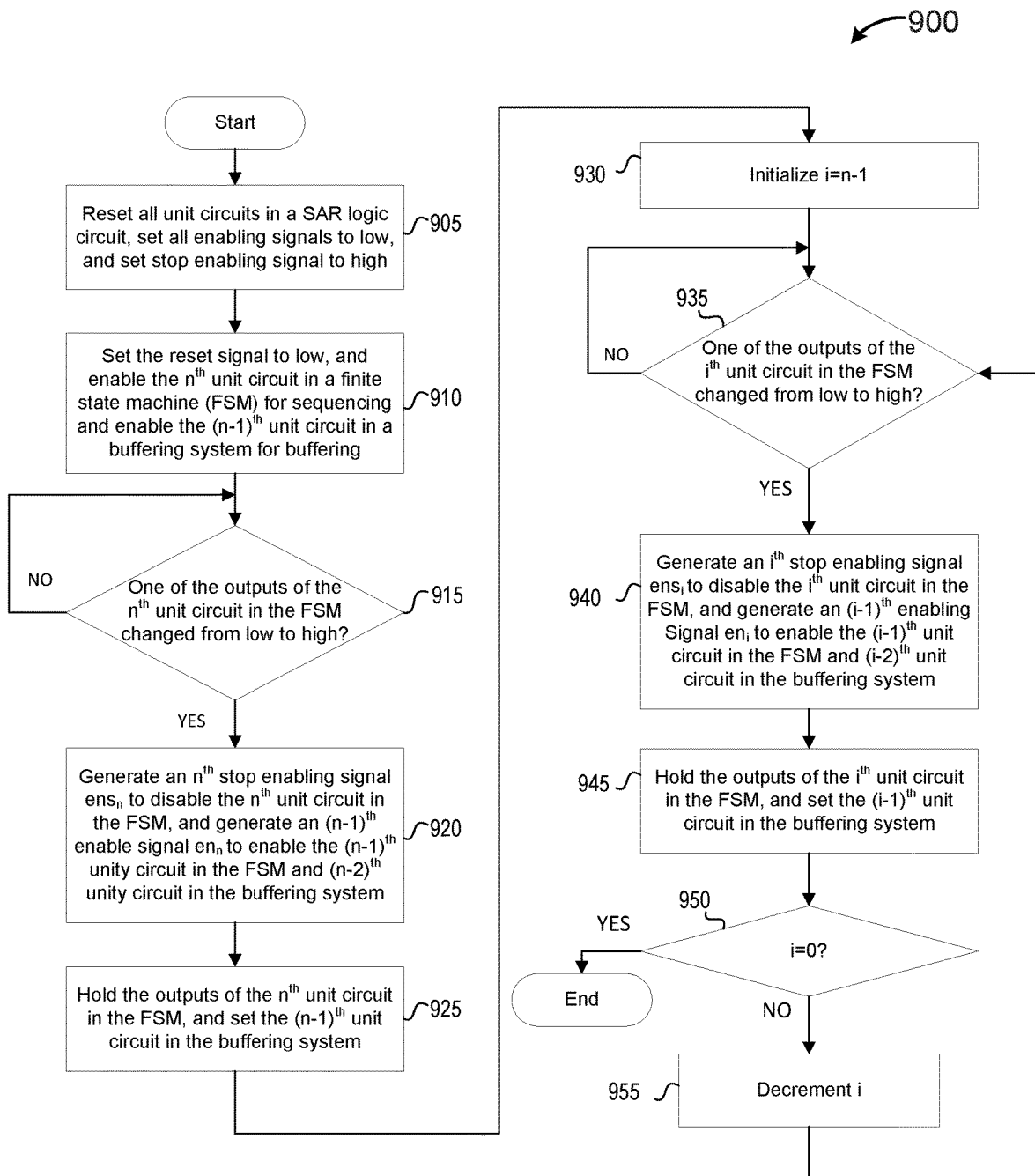
FIG. 9 depicts a flow chart of an exemplary method to operate the SAR logic circuit.

FIG. 9 depicts a flow chart of an exemplary method to operate the SAR logic circuit. An exemplary method 900 to operate a SAR logic circuit (e.g., the SAR logic circuit 260 in FIG. 3) includes, at 905, resetting all unit circuits (e.g., $U_6$-$U_0$, and $B_5$-$B_0$) in the SAR logic circuit 260, and setting all enabling signals 515 (e.g., $en_6$-$en_0$) to low, and setting all stop enabling signals 520 (e.g., $ens_6$-$ens_0$, $ens'_5$-$ens'_0$) to high. The method also includes, at 910, setting the reset signal to low, and enabling the $n^{th}$ unit circuit $U_{n-1}$ (e.g., $U_6$) in a finite state machine (FSM) (e.g., sequencer 265) for sequencing and enabling the $(n-1)^{th}$ unit circuit $B_{n-2}$ (e.g., $B_5$) in a buffering system (e.g., buffering system 270) for buffering.

When, at 915, there is a change at the inputs of the $n^{th}$ unit circuit $U_{n-1}$, and the outputs of the $n^{th}$ unit circuit $U_{n-1}$ in the sequencer 265 is changed from low to high, then, at 920, the $n^{th}$ unit circuit $U_{n-1}$ may generate an $n^{th}$ stop enabling signal $ens_n$ to disable the $n^{th}$ unit circuit $U_{n-1}$ in the sequencer 265, and generate an $(n-1)^{th}$ enable signal $en_{n-1}$ to enable the $(n-1)^{th}$ unity circuit $U_{n-2}$ in the sequencer 265 and $(n-2)^{th}$ unity circuit $B_{n-3}$ in the buffering system 270. Then, at 925, the comparator decision (e.g., $V_{cpn}$, $V_{cnn}$) of the $n^{th}$ unit circuit $U_{n-1}$ in the sequencer 265 are held at the $n^{th}$ unit circuit $U_{n-1}$ outputs, and a corresponding DAC control signal at the $(n-1)^{th}$ unit circuit $B_{n-2}$ in the buffering system 270 is set.

Then, at 930, a variable i is introduced and initialized to n−1. At 935, if the outputs of the $i^{th}$ unit circuit $U_{i-1}$ in the sequencer 265 is changed from low to high, then, at 940, the $i^{th}$ unit circuit may generate an $i^{th}$ stop enabling signal $ens_i$ to disable the $i^{th}$ unit circuit $U_{i-1}$ in the sequencer 265, and generate an $(i-1)^{th}$ enable signal $en_{i-1}$ to enable the $(i-1)^{th}$ unity circuit $U_{i-2}$ in the sequencer 265 and $(i-2)^{th}$ unity circuit $B_{i-2}$ in the buffering system 270. Then, at 945, the comparator decision (e.g., $V_{cpn}$, $V_{cnn}$) of the $i^{th}$ unit circuit in the sequencer 265 are held at the $i^{th}$ unit circuit outputs, and a corresponding DAC control signal at the $(i-1)^{th}$ unit circuit in the buffering system 270 is set. If there are more unit circuits in the sequencer 265 (e.g., at 950, i is not equal to 0), then, at 955, the variable i is decremented, and the method loops back to 935. Otherwise, the method 900 ends.

For example, the 7-bit SAR logic circuit 500 may be operated as follows: at the beginning of the conversion cycle, all the unit circuits may be in the reset state, the enabling signals may be low and the stop enabling signals may be high. Once the reset signal is set to low, $U_6$ and $B_5$ may be enabled and, after $U_6$ inputs change, $Q_{d6}$ or $Q_{db6}$ may rise from low to high. $U_6$ output change may force the NOR gate $305_6$ output $ens_6$ to fall from high to low to disable $U_6$ and force the inverter $310_6$ output to rise from low to high to enable the circuit $U_5$ and bank $B_4$. The comparator decision may be held at $U_6$ outputs ($Q_{d6}$ signal represents the decision). The DAC control signal at $B_5$ outputs is set ($Q_{DAC5}$ and $Q_{DACb5}$ LOW or the inverse).

Once $U_5$ enable signal is high and after $U_5$ inputs change (comparator takes its decision), $Q_{d5}$ or $Q_{db5}$ may rise from low to high. $U_5$ output change may force the NOR $305_5$ output $ens_5$ to fall from high to low to disable $U_5$ and force the inverter $310_5$ output to rise from low to high to enable the circuit $U_4$ and bank $B_3$. The comparator decision may be held at $U_5$ outputs ($Q_{d5}$ signal represents the decision). The DAC control signal at $B_4$ outputs may be set ($Q_{DAC4}$ and $Q_{DACb4}$ LOW or the inverse).

Once $U_4$ enable signal is high and after $U_4$ inputs change (comparator takes its decision), $Q_{d4}$ or $Q_{db4}$ may rise from low to high. $U_4$ output change may force the NOR $305_4$ output $ens_4$ to fall from high to low to disable $U_4$ and force the inverter $310_4$ output to rise from low to high to enable the circuit $U_3$ and bank $B_2$. The comparator decision may be held at $U_4$ outputs ($Q_{d4}$ signal represents the decision). The DAC control signal at $B_3$ outputs may be set ($Q_{DAC3}$ and $Q_{DACb3}$ LOW or the inverse).

Once $U_3$ enable signal is high and after $U_3$ inputs change (comparator takes its decision), $Q_{d3}$ or $Q_{db3}$ may rise from low to high. $U_3$ output change may force the NOR $305_3$ output $ens_3$ to fall from high to low to disable $U_3$ and force the inverter $310_3$ output to rise from low to high to enable the circuit $U_2$ and bank $B_1$. The comparator decision may be held at $U_3$ outputs ($Q_{d3}$ signal represents the decision). The DAC control signal at $B_2$ outputs may be set ($Q_{DAC2}$ and $Q_{DACb2}$ LOW or the inverse).

Once $U_2$ enable signal is high and after $U_2$ inputs change (comparator takes its decision), $Q_{d2}$ or $Q_{db2}$ may rise from low to high. $U_2$ output change may force the NOR $305_2$ output $ens_2$ to fall from high to low to disable $U_2$ and force the inverter $310_2$ output to rise from low to high to enable the circuit $U_1$ and bank $B_0$. The comparator decision may be held at $U_2$ outputs ($Q_{d2}$ signal represents the decision). The DAC control signal at $B_1$ outputs may be set ($Q_{DAC1}$ and $Q_{DACb1}$ LOW or the inverse).

Once $U_1$ enable signal is high and after $U_1$ inputs change (comparator takes its decision), $Q_{d1}$ or $Q_{db1}$ may rise from low to high. $U_1$ output change may force the NOR $305_1$ output $ens_1$ to fall from high to low to disable $U_1$ and force the inverter $310_1$ output to rise from low to high to enable the circuit $U_0$. The comparator decision may be held at $U_1$ outputs ($Q_{d1}$ signal represents the decision). Once $U_0$ enable signal is high and after $U_0$ inputs change (comparator takes its decision), $Q^{d0}$ or $Q_{db0}$ may rise from low to high. The comparator decision may be held at $U_0$ outputs ($Q_{d0}$ signal represents the decision). Although in this depicted example, only NOR gate is discussed. In some implementations, the XOR gate may be used to replace the NOR gate. The position of the inversion circuit may be corresponding changed to disable the current unit circuit and enable the next unit circuit in the sequencer 265.

Although various embodiments have been described with reference to the figures, other embodiments are possible. For example, IC 215 may be a programmable logic block. In some embodiments, IC 215 may be a hard block fixed circuitry. For example, an application specific integrated circuit (ASIC) may provide a receiver for data communication with customized hardware circuitry. In some embodiments, IC 215 may be a system-on-chip (SOC). The ADC 225 and the DSP 235 may be arranged at different physical positions. For example, the ADC 225 may be embedded in a programmable logic (PL) block of IC 215, and the DSP 235 may be placed in a processor system (PS) of IC 215.

In some embodiments, the SAR logic circuit 260 may be arranged on the same programmable logic (e.g., FPGA) with the comparator system 255. In other embodiments, the SAR logic circuit 260 may be implemented in a different programmable logic (e.g., another FPGA) to perform sequencing and buffering. In some embodiments, the sequencer 265 and the buffering system 270 may be implemented in two different programmable logic or two different ASICs.

In some embodiments, the SAR logic circuit 260 may be implemented as hard block fixed circuitry. For example, an ASIC may provide a SAR logic circuit for sequencing and buffering with customized hardware circuitry. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

In some embodiments, some or all of the functions of the ADC 225 may be implemented in a processor that is configured to execute a set of instructions stored in a data store to perform data conversion. The processor may be arranged on the same integrated circuit, which may be an FPGA with a receiver. For example, the SAR logic circuit 260 and the data store may be implemented in a programmable logic block of a system-on-chip (SOC) or implemented in a hard block using fixed circuitry of the SOC, and the tracking and holding circuit 240 may be implemented in another hard block using, for example, fixed circuitry of the SOC.

In some embodiments, the circuit reset input buffering may be improved by means of an optimized buffer tree from the reset input to the respective circuits. For example, although all the reset signals in FIG. 3 are simultaneous, in some embodiments, unit circuits in the SAR logic circuit 260 may be operated non-simultaneously by creating one or more delay chains to drive the reset signals. The advantage is that the driving strength of each buffer may be reduced, and the only timing critical buffering path would be the path connected to $U_6$, resulting in power savings. In some embodiments, buffers may be included on some of the outputs of unit circuits of the SAR logic circuit 260 if delay is not critical. In some embodiments, the number of unit circuits in the buffering system 270 may be configured in a variety of ways to achieve reasonable power and delay trade-offs.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   a first transistor having a first gate terminal, a first source terminal, and a first drain terminal, wherein the first gate terminal is coupled to receive a first differential comparison decision signal, the first source terminal is coupled to a predetermined power supply;
   a second transistor having a second gate terminal, a second source terminal, and a second drain terminal, wherein the second gate terminal is coupled to receive a second differential comparison decision signal, the second source terminal is coupled to the predetermined power supply;
   a third transistor having a third gate terminal, a third source terminal, and a third drain terminal, wherein the third drain terminal is coupled to the first drain terminal, the third source terminal is coupled to a predetermined reference voltage;

a fourth transistor having a fourth gate terminal, a fourth source terminal, and a fourth drain terminal, wherein the fourth drain terminal is coupled to the second drain terminal, the fourth source terminal is coupled to the predetermined reference voltage, wherein, the third gate terminal is coupled to the fourth drain terminal, and the fourth gate terminal is coupled to the third drain terminal;

a fifth transistor having a fifth gate terminal, a fifth source terminal, and a fifth drain terminal, wherein the fifth source terminal is coupled to the first gate terminal, the fifth gate terminal is controlled by an enabling signal;

a sixth transistor, having a sixth gate terminal, a sixth source terminal, and a sixth drain terminal, connected to the fifth transistor in series, wherein the sixth drain terminal is coupled to receive the first differential comparison decision signal, and the six gate terminal is controlled by a stop enabling signal;

a seventh transistor having a seventh gate terminal, a seventh source terminal, and a seventh drain terminal, wherein the seventh source terminal is coupled to the second gate terminal, the seventh gate terminal is controlled by the enabling signal; and, an eighth transistor, having an eighth gate terminal, an eighth source terminal, and an eighth drain terminal, connected to the seventh transistor in series, wherein the eighth drain terminal is coupled to receive the second differential comparison decision signal, and the eighth gate terminal is controlled by the stop enabling signal.

2. The circuit of claim 1, further comprising:

a ninth transistor connected with the third transistor in parallel, wherein a ninth gate terminal of the ninth transistor is controlled by a reset signal; and, a tenth transistor connected with the fourth transistor in parallel, wherein a tenth gate terminal of the tenth transistor is controlled by the reset signal.

3. The circuit of claim 2, further comprising:

an eleventh transistor connected with a twelfth transistor in parallel; and, a thirteenth transistor connected with a fourteenth transistor in parallel, wherein, source terminals of the eleventh transistor, the twelfth transistor, the thirteenth transistor, and fourteenth transistor are connected to the predetermined power supply, drain terminals of the eleventh transistor and the twelfth transistor are connected to the first gate terminal, drain terminals of the thirteenth transistor and the fourteenth transistor are connected to the second gate terminal, gate terminals of the eleventh transistor and the thirteenth transistor are controlled by an enabling signal, and, gate terminals of the twelfth transistor and the twelfth transistor are controlled by an inverted signal of the reset signal.

4. A circuit comprising:

a first transistor having a first gate terminal, a first source terminal, and a first drain terminal, wherein the first gate terminal is coupled to receive a first differential comparison decision signal, the first source terminal is coupled to a predetermined power supply;

a second transistor having a second gate terminal, a second source terminal, and a second drain terminal, wherein the second gate terminal is coupled to receive a second differential comparison decision signal, the second source terminal is coupled to the predetermined power supply;

a third transistor having a third gate terminal, a third source terminal, and a third drain terminal, wherein the third drain terminal is coupled to the first drain terminal, the third source terminal is coupled to a predetermined reference voltage;

a fourth transistor having a fourth gate terminal, a fourth source terminal, and a fourth drain terminal, wherein the fourth drain terminal is coupled to the second drain terminal, the fourth source terminal is coupled to the predetermined reference voltage, wherein, the third gate terminal is coupled to the fourth drain terminal, and the fourth gate terminal is coupled to the third drain terminal;

a ninth transistor connected with the third transistor in parallel, wherein a ninth gate terminal of the ninth transistor is controlled by a reset signal; and, a tenth transistor connected with the fourth transistor in parallel, wherein a tenth gate terminal of the tenth transistor is controlled by the reset signal.

5. The circuit of claim 4, further comprising:

an eleventh transistor connected with a twelfth transistor in parallel; and, a thirteenth transistor connected with a fourteenth transistor in parallel, wherein, source terminals of the eleventh transistor, the twelfth transistor, the thirteenth transistor, and fourteenth transistor are connected to the predetermined power supply, drain terminals of the eleventh transistor and the twelfth transistor are connected to the first gate terminal, drain terminals of the thirteenth transistor and the fourteenth transistor are connected to the second gate terminal, gate terminals of the eleventh transistor and the thirteenth transistor are controlled by an enabling signal, and, gate terminals of the twelfth transistor and the twelfth transistor are controlled by an inverted signal of a reset signal.

6. A circuit comprising:

a first transistor having a first gate terminal, a first source terminal, and a first drain terminal, wherein the first gate terminal is coupled to receive a first differential comparison decision signal, the first source terminal is coupled to a predetermined power supply;

a second transistor having a second gate terminal, a second source terminal, and a second drain terminal, wherein the second gate terminal is coupled to receive a second differential comparison decision signal, the second source terminal is coupled to the predetermined power supply;

a third transistor having a third gate terminal, a third source terminal, and a third drain terminal, wherein the third drain terminal is coupled to the first drain terminal, the third source terminal is coupled to a predetermined reference voltage;

a fourth transistor having a fourth gate terminal, a fourth source terminal, and a fourth drain terminal, wherein the fourth drain terminal is coupled to the second drain terminal, the fourth source terminal is coupled to the predetermined reference voltage, wherein, the third gate terminal is coupled to the fourth drain terminal, and the fourth gate terminal is coupled to the third drain terminal;

an eleventh transistor connected with a twelfth transistor in parallel; and, a thirteenth transistor connected with a fourteenth transistor in parallel, wherein, source terminals of the eleventh transistor, the twelfth transistor, the thirteenth transistor, and fourteenth transistor are connected to the predetermined power supply, drain terminals of the eleventh transistor and the twelfth transistor are connected to the first gate terminal, drain terminals of the thirteenth transistor and the fourteenth transistor are connected to the second gate terminal, gate terminals of the eleventh transistor and the thirteenth transistor are controlled by an enabling signal, and, gate terminals of the twelfth transistor and the twelfth transistor are controlled by an inverted signal of a reset signal.

7. The circuit of claim 6, further comprising:
a fifth transistor having a fifth gate terminal, a fifth source terminal, and a fifth drain terminal, wherein the fifth source terminal is coupled to the first gate terminal, the fifth gate terminal is controlled by an enabling signal;
a sixth transistor having a sixth gate terminal, a sixth source terminal, and a sixth drain terminal, connected to the fifth transistor in series, wherein the sixth drain terminal is coupled to receive the first differential comparison decision signal, and the six gate terminal is controlled by a stop enabling signal;
a seventh transistor having a seventh gate terminal, a seventh source terminal, and a seventh drain terminal, wherein the seventh source terminal is coupled to the second gate terminal, the seventh gate terminal is controlled by the enabling signal; and,
an eighth transistor, having an eighth gate terminal, an eighth source terminal, and an eighth drain terminal, connected to the seventh transistor in series, wherein the eighth drain terminal is coupled to receive the second differential comparison decision signal, and the eighth gate terminal is controlled by the stop enabling signal.

8. A system comprising:
a sequencer, having N unit circuits, coupled to receive one or more comparison decision signals from a comparator system, wherein each unit circuit of the N unit circuits comprises:
a first transistor having a first gate terminal, a first source terminal, and a first drain terminal, wherein the first gate terminal is coupled to receive a first differential comparison decision signal, the first source terminal is coupled to a predetermined power supply;
a second transistor having a second gate terminal, a second source terminal, and a second drain terminal, wherein the second gate terminal is coupled to receive a second differential comparison decision signal, the second source terminal is coupled to the predetermined power supply;
a third transistor having a third gate terminal, a third source terminal, and a third drain terminal, wherein the third drain terminal is coupled to the first drain terminal, the third source terminal is coupled to a predetermined reference voltage;
a fourth transistor having a fourth gate terminal, a fourth source terminal, and a fourth drain terminal, wherein the fourth drain terminal is coupled to the second drain terminal, the fourth source terminal is coupled to the predetermined reference voltage,
wherein, the third gate terminal is coupled to the fourth drain terminal, and the fourth gate terminal is coupled to the third drain terminal;
a buffering system, having N−1 unit circuits, coupled to receive one or more comparison decision signals from the comparator system, wherein each unit circuit of the N−1 unit circuits has the same structure with the unit circuit of the N unit circuits.

9. The system of claim 8, wherein, an ith unit circuit in the sequencer configured to receive an ith comparison decision signal from the comparator system to generate an ith output signal, and, an (i−1)th unit circuit in the buffering system configured to receive the ith comparison decision signal to generate an ith buffering signal.

10. The system of claim 9, further comprises:
an ith NOR gate in the sequencer coupled to receive the ith output signal and generate a stop enabling signal for the ith unit circuit of the sequencer; and,
an ith inversion circuit in the sequencer coupled to receive the stop enabling signal to generate an enable signal for an (i−1)th unit circuit of the sequencer and an (i−2)th unit circuit of the buffering system.

11. The system of claim 10, further comprises:
an ith NOR gate in the buffering system coupled to receive the ith buffering signal and generate a stop enabling signal for the ith unit circuit of the buffering system.

12. The system of claim 10, further comprises:
an n-input selector configured to receive N enabling signals of the N unit circuits in the sequencer and generate a clock signal in response to a selection signal; and,
a decoder configured to receive a command signal to generate the selection signal.

13. The system of claim 8, wherein the comparator system comprises up to N comparators.

14. A method comprising:
providing a first transistor having a first gate terminal, a first source terminal, and a first drain terminal, coupling the first gate terminal to receive a first differential comparison decision signal and coupling the first source terminal to a predetermined power supply;
providing a second transistor having a second gate terminal, a second source terminal, and a second drain terminal, coupling the second gate terminal to receive a second differential comparison decision signal and coupling the second source terminal to the predetermined power supply;
providing a third transistor having a third gate terminal, a third source terminal, and a third drain terminal, coupling the third drain terminal to the first drain terminal and coupling the third source terminal to a predetermined reference voltage;
providing a fourth transistor having a fourth gate terminal, a fourth source terminal, and a fourth drain terminal, coupling the fourth drain terminal to the second drain terminal and coupling the fourth source terminal to the predetermined reference voltage;
coupling the third gate terminal to the fourth drain terminal and coupling the fourth gate terminal to the third drain terminal;
providing a fifth transistor having a fifth gate terminal, a fifth source terminal, and a fifth drain terminal, coupling the fifth source terminal to the first gate terminal and coupling the fifth gate terminal to an enabling signal; and,
providing a seventh transistor having a seventh gate terminal, a seventh source terminal, and a seventh drain terminal, coupling the seventh source terminal to the second gate terminal and coupling the seventh gate terminal to the enabling signal.

15. The method of claim 14, further comprising:

providing a sixth transistor having a sixth gate terminal, a sixth source terminal, and a sixth drain terminal, and connecting the sixth transistor to the fifth transistor in series, coupling the sixth drain terminal to receive the first differential comparison decision signal, and coupling the six gate terminal to a stop enabling signal; and, providing an eighth transistor having an eighth gate terminal, an eighth source terminal, and an eighth drain terminal, connected the eighth transistor to the seventh transistor in series, and coupling the eighth drain terminal to receive the second differential comparison decision signal, and coupling the eighth gate terminal to the stop enabling signal.

16. The method of claim 15, further comprising:

providing a ninth transistor connected to the third transistor in parallel, wherein a gate terminal of the ninth transistor is controlled by a reset signal; and, providing a tenth transistor connected to the fourth transistor in parallel, wherein a gate terminal of the tenth transistor is controlled by the reset signal.

17. The method of claim 16, further comprising:

providing an eleventh transistor connected to a twelfth transistor in parallel; and, providing a thirteenth transistor connected to a fourteenth transistor in parallel, wherein, source terminals of the eleventh transistor, the twelfth transistor, the thirteenth transistor, and fourteenth transistor are connected to the predetermined power supply, drain terminals of the eleventh transistor and the twelfth transistor are connected to the first gate terminal, drain terminals of the thirteenth transistor and the fourteenth transistor are connected to the second gate terminal, gate terminals of the eleventh transistor and the thirteenth transistor are controlled by the enabling signal, and, gate terminals of the twelfth transistor and the twelfth transistor are controlled by an inverted reset signal.

* * * * *